United States Patent
Sano et al.

(10) Patent No.: US 7,531,467 B2
(45) Date of Patent: May 12, 2009

(54) MANUFACTURING METHOD OF SEMICONDUCTOR DEVICE AND SUBSTRATE PROCESSING APPARATUS

(75) Inventors: Atsushi Sano, Toyama (JP); Sadayoshi Horii, Toyama (JP); Hideharu Itatani, Toyama (JP); Masayuki Asai, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 297 days.

(21) Appl. No.: 10/574,571

(22) PCT Filed: Jan. 21, 2005

(86) PCT No.: PCT/JP2005/000751

§ 371 (c)(1),
(2), (4) Date: Apr. 28, 2006

(87) PCT Pub. No.: WO2005/071723

PCT Pub. Date: Aug. 4, 2005

(65) Prior Publication Data

US 2007/0042581 A1   Feb. 22, 2007

(30) Foreign Application Priority Data

Jan. 21, 2004   (JP)   ............................ 2004-012885

(51) Int. Cl.
*H01L 21/31*   (2006.01)

(52) U.S. Cl. ..................... 438/785; 438/762; 438/763; 438/775; 257/E21.636; 257/E21.639

(58) Field of Classification Search ................. 438/758, 438/762, 763, 775, 785; 257/E21.636, E21.639
See application file for complete search history.

(56) References Cited

U.S. PATENT DOCUMENTS

| | | | |
|---|---|---|---|
| 6,399,208 B1 * | 6/2002 | Baum et al. | 428/446 |
| 6,884,719 B2 * | 4/2005 | Chang et al. | 438/681 |
| 2002/0172768 A1 | 11/2002 | Endo et al. | |
| 2002/0195643 A1 * | 12/2002 | Harada | 257/310 |
| 2003/0168705 A1 | 9/2003 | Tanida et al. | |
| 2003/0232501 A1 * | 12/2003 | Kher et al. | 438/689 |
| 2004/0040501 A1 * | 3/2004 | Vaartstra | 118/715 |
| 2004/0164329 A1 | 8/2004 | Hirano et al. | |
| 2004/0171276 A1 | 9/2004 | Watanabe et al. | |
| 2004/0188778 A1 * | 9/2004 | Aoyama | 257/410 |

FOREIGN PATENT DOCUMENTS

| | | |
|---|---|---|
| JP | A-2002-343790 | 11/2002 |
| JP | A 2002-343790 | 11/2002 |

(Continued)

*Primary Examiner*—Alexander G Ghyka
*Assistant Examiner*—Seahvosh J Nikmanesh
(74) *Attorney, Agent, or Firm*—Oliff & Berridge, PLC

(57) ABSTRACT

To provide a manufacturing method of a semiconductor device and a substrate processing apparatus capable of easily controlling a nitrogen concentration distribution in a film containing a metal atom and a silicon atom, and manufacturing a high quality semiconductor device.

The method comprises a step of forming a film containing the metal atom and the silicon atom on a substrate 30 in a reaction chamber 4, and performing a nitriding process for the film, wherein the film is formed by changing a silicon concentration at least in two stages in the step of forming a film.

3 Claims, 16 Drawing Sheets

FOREIGN PATENT DOCUMENTS

| | | |
|---|---|---|
| JP | A-2003-279885 | 10/2003 |
| JP | A 2004-006699 | 1/2004 |
| JP | A 2004-259906 | 9/2004 |
| JP | A-2005-45166 | 2/2005 |
| JP | A 2005-045166 | 2/2005 |
| WO | WO 03/019643 | 3/2003 |

* cited by examiner

MANUFACTURING METHOD OF SEMICONDUCTOR DEVICE AND SUBSTRATE PROCESSING APPARATUS

TECHNICAL FIELD

The present invention relates to a substrate processing apparatus for processing a substrate such as a semiconductor wafer or the like and a manufacturing method of a semiconductor device.

BACKGROUND ART

As one of semiconductor manufacturing steps, there is a step of performing a predetermined film-forming process on a surface of a substrate (a substrate to be processed having a silicon wafer and glass as a base and on which a fine pattern of electric circuit is formed). In a step of forming a gate insulating film in the predetermined film-forming process, along with a thinning of a film thickness of the gate insulating film, a change from oxide film and oxynitride film of silicon (Si) to a High-k (high dielectric constant) film is has been actively studied. As a method of forming a high-k film of $ZrO_2$, $HfO_2$ or the like, a sputtering method and a CVD (Chemical Vapor Deposition) method are being studied. The CVD method has a characteristic of step coverage having an advantage that exchanging of film forming sources is facilitated. Therefore, the CVD method is frequently applied in a mass production phase.

In the formation of the high-k film, MOCVD (Metal Organic Chemical Vapor Deposition) that is one kind of the CVD is applied. In the MOCVD, an organometallic source is used as a source gas. The organometallic sources are varied and each kind of them has been respectively studied. As the sources of $HfO_2$, $HfSiO_4$ or the like, for instance, $Hf[OC(CH_3)_3]_4$ (abbreviated as Hf-OtBu), $Hf[OC(CH_3)_2CH_2OCH_3]_4$ (hereinafter, abbreviated as Hf-MMP), $Si[OC(CH_3)_2CH_2OCH_3]_4$ (hereinafter, abbreviated as Si-MMP), $Hf[O—Si—(CH_3)]_4$ (hereinafter, abbreviated as Hf-OSi) and so on are used. Among these, for instance, Hf-MMP and Si-MMP show a liquid phase at about 30° C. under normal pressure. Accordingly, these liquid materials are heated and transformed into gas by vapor pressure and used. The CVD using Hf-MMP, which is one of the sources of the MOCVD method is known (for example, see patent document 1).

Patent document 1: JP-A-2004-6699

DISCLOSURE OF INVENTION

Problem to be Solved

In order to keep a $HfO_2$ film in an amorphous state, Si is introduced into the $HfO_2$ film. A film obtained by introducing Si into the $HfO_2$ film, that is, an oxide film containing Hf and Si is called a hafnium silicate film (hereinafter, referred to as HfSiO film). By introducing Si into $HfO_2$ film, it becomes also possible to sufficiently introduce nitrogen into the HfSiO film in a structure of introducing boron into an upper electrode, the nitrogen being considered to be effective for preventing boron from being passed through the substrate.

Conventional art tries to control a nitrogen distribution in an arbitrary HfSiO film by controlling a condition/method of introducing nitrogen. Particularly, when the HfSiO film is applied as a gate insulating film, a degradation of characteristics of a transistor is caused when the nitrogen is introduced in an interface between the hafnium silicate film and Si which is an under layer and an active region of a gate. This is because the nitrogen (N) itself disturbs a path of electrons to inhibit electrons from traveling in the active region of the transistor. Accordingly, it is necessary to inhibit the nitrogen from being introduced into the interface between the hafnium silicate film and Si. However, it is difficult to control the nitrogen concentration in a silicate film so as not to introduce nitrogen into the interface.

An object of the invention is to provide a manufacturing method of a semiconductor device capable of manufacturing a high quality semiconductor device by easily controlling a nitrogen concentration distribution in the film, and a substrate processing apparatus.

Means for Solving the Problems

The inventors found that when nitrogen is introduced into a film containing metal atoms and silicon atoms there is a correlation between a silicon concentration and a nitrogen concentration in a film containing metal atoms and silicon atoms. A film containing metal atoms and silicon atoms can be formed by introducing silicon into a metal oxide film, for example. Accordingly, when an introduction control of the silicon into the metal oxide film is possible, a nitrogen concentration in a film can be controlled. However, the introduction of the silicon into the metal oxide film is difficult. The inventors of the present invention achieves this invention by obtaining a knowledge that the nitrogen concentration can be controlled by controlling the silicon concentration during forming the film containing metal atom and silicon atom.

A first aspect of the present invention provides a manufacturing method of a semiconductor device, comprising the steps of:

forming a film containing a metal atom and a silicon atom on a substrate; and performing a nitriding process for the film, wherein the film is formed by changing a silicon concentration in at least two stages in the step of forming a film.

When, the film is formed by changing the silicon concentration in at least two stages in the step of forming the film, in accordance with change of the silicon concentration, the nitrogen concentration can be changed in at least two stages in the step of performing the nitriding process.

A second aspect of the present invention provides a manufacturing method of a semiconductor device, wherein the film having different silicon concentration in a depth direction is formed in the step of forming a film.

When the film having different silicon concentration is formed in the depth direction of the film, the nitrogen concentration can be changed in the depth direction of the film.

A third aspect of the present invention provides a manufacturing method of a semiconductor device, wherein the film composed of two or more layers having different silicon concentrations is formed in the step of forming a film.

When the film composed of two or more layers having different silicon concentrations is formed, plural layers having different silicon concentration is only required to be formed, and the silicon concentration of each layer is not required to be differentiated in the depth direction but can be kept in a specified concentration. Therefore, the control of the silicon concentration can be facilitated.

A fourth aspect of the present invention provides the manufacturing method of the semiconductor device according to the first aspect of the present invention, wherein the film is formed in the step of forming a film, so that the surface side of the film has a larger silicon concentration than that of a substrate side.

When the film is formed so that the surface side of the film has a larger silicon concentration than that of the substrate side, the surface side of the film has a larger nitrogen concentration than that of the substrate side in the nitrogen processing step.

A fifth aspect of the present invention provides the manufacturing method of the semiconductor device according to the first aspect of the present invention, wherein the film is formed, so that a surface side of the film becomes silicon-rich, and a substrate side of the film becomes metal-rich.

When the film is formed so that the surface side of the film becomes silicon-rich and the substrate side becomes metal-rich, a nitride silicon film can be formed on the surface side of the film, leaving a metal silicate film on the substrate side, in the nitride processing step.

A sixth aspect of the present invention provides the manufacturing method of the semiconductor device according to the first aspect of the present invention, wherein the film is formed by using a first source containing a metal atom and a second source containing a silicon atom, intermittently feeding each source to the substrate, and changing a supply flow rate or supply time of each source respectively.

When the film is formed by intermittently feeding each of the sources to the substrate, and changing the supply flow rate or the supply time of each of the sources, respectively, in accordance with the supply flow rate and supply time of each of the sources, the silicon concentration can be arbitrarily changed in the depth direction.

A seventh aspect of the present invention provides the manufacturing method of the semiconductor device according to the first aspect of the present invention, wherein the metal atom is hafnium and the film is a hafnium silicate film.

When the metal atom is hafnium and the film is a hafnium silicate film, the nitrogen concentration in the hafnium silicate can be changed at least in two stages.

An eighth aspect of the present invention provides the manufacturing method of the semiconductor device according to the first aspect of the present invention, wherein the step of performing a nitriding process is conducted in the same reaction chamber as the reaction chamber where the step of forming a film is conducted.

When the step of performing the nitriding process is conducted in the same reaction chamber as the reaction chamber where the step of forming the film is conducted, the film is formed with excellent productivity.

A ninth aspect of the present invention provides the manufacturing method of the semiconductor device according to the first aspect of the present invention, wherein the nitriding processing step is conducted in a processing chamber connected to a reaction chamber where the film forming step is conducted through a transfer chamber.

When the step of performing the nitriding processing step is conducted in a processing chamber connected to the reaction chamber where the film forming step is conducted through the transfer chamber, the nitriding process can be efficiently performed.

A tenth aspect of the present invention provides the manufacturing method of the semiconductor device according to the first aspect of the present invention, wherein the nitiriding processing step is conducted by an RPN process, an MMT nitriding process, or an RTN process.

When the step of performing the nitriding process is conducted with the RPN process, the MMT nitriding process, or the RTN process, the nitriding process can be more efficiently performed.

An eleventh aspect of the present invention provides the manufacturing method of the semiconductor device, comprising the steps of forming a film containing metal atom and silicon atom on a substrate, and introducing nitrogen into the film, wherein in the nitrogen introducing step, the concentration of the nitrogen to be introduced into the film is controlled by the silicon concentration in the film formed in the film forming step.

When the concentration of the nitrogen to be introduced into the film in the step of introducing nitrogen is controlled by a silicon concentration in the film formed in the film forming step, a control range of the nitrogen concentration can be expanded.

A twelfth aspect of the present invention provides a manufacturing method of a semiconductor device comprising the steps of:

carrying a substrate into a reaction chamber;

processing the substrate by feeding a first source gas obtained by vaporizing a first source which is prepared by mixing plural kinds of liquid sources, and a second source gas obtained by vaporizing a second source which is prepared by mixing plural kinds of liquid sources at a mixing ratio different from that of the first source or composed of one kind of liquid source; and carrying the substrate after processing out of the reaction chamber.

Since, in the step of processing the substrate, plural kinds of liquid sources are mixed, the controllability of a liquid flow rate can be easily secured. Accordingly, the controllability of a composition ratio of elements in the film can be enhanced.

A thirteenth aspect of the present invention provides the manufacturing method of the semiconductor device according to the twelfth aspect of the present invention, wherein supply flow rates of the first source and/or the second source are respectively changed in the step of processing the substrate.

When the supply flow rates of the first source and/or the second source are respectively changed during the step of forming the film, a composition ratio of elements in the film can be changed in a depth direction.

A fourteenth aspect of the present invention provides the manufacturing method of the semiconductor device according to the twelfth aspect of the present invention, wherein the first source gas and the second source gas are simultaneously fed to the substrate in the step of processing a substrate.

When the first source gas and the second source gas are simultaneously fed to the substrate, a film-forming method for forming a deposited film using a general CVD method, can be used.

A fifteenth aspect of the present invention provides the manufacturing method of the semiconductor device according to the twelfth aspect of the present invention, wherein the first source gas and the second source gas are alternately fed to the substrate in the step of processing a substrate.

When the first source gas and the second source gas are alternately fed to the substrate, the film-forming method for forming the deposited film using a cyclic CVD method, can be used.

A sixteenth aspect of the present invention provides the manufacturing method of the semiconductor device wherein feeding of the first source gas and the second source gas, and feeding of a third source gas different form the first source gas and the second source gas are alternately performed at least once or more in the step of processing the substrate.

Since feeding of the first source gas and the second source gas and feeding of the third source gas are alternately performed at least once or more, a film-formation by a cyclic CVD method having a reforming treatment of the film can be performed.

A seventeenth aspect of the present invention provides the manufacturing method of the semiconductor device according to the twelfth aspect of the present invention, feeding of the first source gas and feeding of the second source gas are alternately performed at least once or more, with feeding of the third source gas different from the first source gas and the second source gas intervened therebetween in the step of processing a substrate.

Since feeding of the first source gas and feeding of the second source gas are alternately performed at least once or more, with feeding of the third source gas different from the first source gas and the second source gas intervened therebetween, the reforming treatment of the film can be effectively performed while forming the film by the cyclic CVD method.

An eighteenth aspect of the present invention provides the manufacturing method of the semiconductor device according to the twelfth aspect of the present invention, plural kinds of liquid sources constituting the first source are a hafnium liquid source and a silicon liquid source, one kind of liquid source constituting the second source is either of the hafnium liquid source or the silicon liquid source, and a process means to form a Hf silicate film.

When the processing of the substrate means to form the Hf silicate film, the controllability of the composition ratio of the film composed of hafnium and silicon can be enhanced.

A nineteenth aspect of the present invention provides the manufacturing method of the semiconductor device according to the eighteenth aspect of the present invention, wherein a mixing ratio of the silicon liquid source and the hafnium liquid source (silicon liquid source/hafnium liquid source) in the first source is set to be in a range from 100 to 1000.

When the mixing ratio is set to be in the range from 100 to 1000, the composition ratio (number of hafnium atoms/number of (hafnium+silicon) atoms) of the hafnium silicate film thus formed can be made in the vicinity of 0.1.

A twentieth aspect of the present invention provides the manufacturing method of the semiconductor device according to the eighteenth aspect of the present invention, wherein by changing a supply flow rate of the first source and/or the second source in the step of processing a substrate, the composition ratio (number of hafnium atoms/(number of (hafnium+silicon) atoms) of the hafnium silicate film formed on the substrate is controlled in a depth direction in the range from 0.1 to 1.0.

When the composition ratio of the hafnium silicate film formed on the substrate is controlled in the depth direction of the film in the range from 0.1 to 1.0, the vicinity of the surface of the hafnium silicate film becomes silicon-rich and the vicinity of the substrate of the hafnium silicate film becomes hafnium-rich.

A twenty-first aspect of the present invention provides the manufacturing method of the semiconductor device according to the twentieth aspect of the present invention, further comprising the step of nitriding the hafnium silicate film that is formed in the step of processing the substrate.

When a step of nitriding the hafnium silicate film is further included, the nitrogen concentration in the vicinity of the surface of the hafnium silicate film can be heightened and the nitrogen concentration in the vicinity of the substrate of the hafnium silicate film can be lowered.

A twenty-second aspect of the present invention provides a substrate processing apparatus, comprising:

a reaction chamber for processing a substrate;

a first tank for housing a first source prepared by mixing plural kinds of liquid sources;

a second tank for housing a second source prepared by mixing the plural kinds of liquid sources at a mixing ratio different from that of the first source, or composed of one kind of liquid source;

a first liquid flow rate controller that controls a liquid flow rate of the first source;

a second liquid flow rate controller that controls the liquid flow rate of the second source;

a first vaporizer that vaporizes a flow rate-controlled first source;

a second vaporizer that vaporizes a flow rate-controlled second source; and a feed port that feeds the first source gas and second source gas obtained by vaporization, to the reaction chamber.

The first source in the first tank, which is prepared by mixing plural kinds of liquid sources, is flow rate-controlled by the first liquid flow rate controller and vaporized at the first vaporizer, and fed to the reaction chamber from the feed port. The second source in the second tank, which is prepared by mixing plural kinds of liquid sources at a mixing ratio different from the mixing ratio of the first source, or which includes one kind of liquid source, is flow rate-controlled by the second liquid flow rate controller and vaporized at the second vaporizer, and fed to the reaction chamber from the feed port.

Since plural kinds of liquid sources are mixed, the controllability of the liquid flow rate can be easily secured. Accordingly, in the reaction chamber, a metal silicate film having a composition ratio in accordance with a mixing ratio of the first source and second source can be formed on the substrate.

A twenty-third aspect of the present invention provides a substrate processing apparatus according to the twenty second aspect of the present invention, comprising a controller to control the flow rate so that a set value of the first liquid flow rate controller or/and the second liquid flow rate controller is changed during processing the substrate.

When the controller to control the flow rate so that the set value of the first liquid flow rate controller or/and the second liquid flow rate controller is changed during processing a substrate, a composition ratio in the metal silicate film can be controlled in a depth direction.

Advantage of the Invention

According to the invention, by changing a silicon concentration in a film, a nitrogen concentration distribution in the film can be easily controlled. Thereby, a high quality semiconductor device can be manufactured.

BEST MODE FOR CARRYING OUT THE INVENTION

In what follows, embodiments of the invention will be described with reference to the drawings.

First Embodiment

Though will be detailed below, in the first embodiment, a case where an amorphous hafnium silicate film (hereinafter, simply referred to as HfSiO film) is formed by using a CVD method, more specifically, an MOCVD method will be described.

FIG. 1 is a schematic diagram showing an example of a single wafer processing CVD unit that is a substrate processing apparatus involving an embodiment.

A reaction chamber 4 where a substrate 30 such as a silicon wafer or the like is processed includes a susceptor 42 as a substrate support table that supports the substrate 30. The susceptor 42 is provided with a heater 43 for heating the substrate 30 and in a wall of the reaction chamber a heater 41 for heating the wall of the reaction chamber is buried.

To the reaction chamber 4, a Hf source gas feed piping 17a that feeds a gas obtained by vaporizing a Hf source as a first source containing a metal atom, a Si source gas feed piping 17b that feeds a gas obtained by vaporizing a Si source as a second source containing a Si atom, an inert gas feed piping 12 that feeds an inert gas such as $N_2$ or the like and an oxidizing gas feed piping 16 that feeds oxygen (oxidizing gas) activated by remote plasma are connected. The Hf source gas feed piping 17a and the Si source gas feed piping 17b, respectively, are provided with a bypass piping 11a and a bypass piping 11b. Furthermore, to the Hf source gas feed piping 17a and the Si source gas feed piping 17b, a vaporizer 3a and a vaporizer 3b that vaporizes the Hf liquid source and the Si liquid source are connected respectively. To the vaporizer 3a and vaporizer 3b, a Hf liquid source feed piping 13a and a Si liquid source feed piping 13b are respectively connected. To the Hf liquid source feed piping 13a and the Si liquid source feed piping 13b, a liquid flow rate controller 18a and a liquid flow rate controller 18b are respectively disposed. Furthermore, to the Hf liquid source feed piping 13a and the Si liquid source feed piping 13b, a Hf liquid source vessel 1 and a Si liquid source vessel 2 are respectively connected. To the source vessel 1 and source vessel 2, a pressure gas feed piping 15a and a pressure gas feed piping 15b that feed pressure gas for pushing out the respective sources in the vessels to the Hf liquid source feed piping 13a and Si liquid source feed piping 13b are connected. With such a configuration, when pressure gas such as $N_2$ or the like is fed to the source vessels 1 and 2, the respective liquid sources are pushed out to the liquid source feed pipings 13a and 13b, the pushed out liquid sources are flow rate-controlled by the liquid flow rate controllers 18a and 18b, and the flow rate-controlled liquid sources are vaporized by the vaporizers 3a and 3b and fed through the source gas feed pipings 17a and 17b inside of the reaction chamber 4 as a source gas. Oxidizing gas, after activated through a remote plasma unit 20, can be fed into the reaction chamber 4.

Furthermore, to the reaction chamber 4, an exhaust piping 14 that evacuates the inside of the reaction chamber is connected and to the exhaust piping 14 an exhaust unit 5 such as a vacuum pump or the like is connected. The respective gases introduced into the reaction chamber 4 go through the exhaust piping 14 and the exhaust unit 5 to a back-half unit such as a harm-removing unit (not shown in the drawing) or the like. To the pipings in the drawing, a not-shown heater is provided.

To the reaction chamber 4, a not shown transfer chamber adjoins through a gate valve, and to the transfer chamber and a cooling chamber and a load lock chamber are connected. The transfer chamber is provided with a transfer unit, and a substrate is introduced from the transfer chamber into the reaction chamber 4 and, after the process of the film-formation or the like is applied in the reaction chamber 4, carried through the transfer chamber into the cooling chamber.

Furthermore, a controller 50 that is a controller controls operations of the respective portions that constitute the single wafer processing CVD unit such as the liquid flow rate controllers 18a and 18b, the vaporizers 3a and 3b, the remote plasma unit 20, the exhaust unit 5, the heater 43 for heating a substrate, the heater 41 for heating a wall of the reaction chamber and so on.

In the next place, a procedure where with a single wafer processing CVD unit having a configuration as shown in the FIG. 1 a HfSiO film is deposited will be described. Here, an example where as a Hf source Hf-MMP is used, as a Si source Si-MMP is used, as an inert gas nitrogen ($N_2$)/helium (He)/argon (Ar) is used and as an oxidant oxygen ($O_2$) is used will be described.

In the description below, the controller 50 controls operations of the respective portions that constitute the single wafer processing CVD unit.

A substrate is carried by use of a transfer unit from the transfer chamber in the reaction chamber 4. The substrate is heated to a processing temperature and pressure inside of the reaction chamber is controlled so as to be processing pressure. Thereafter, in the step of forming a film, a source gas, that is, a Hf source gas obtained by vaporizing Hf-MMP and a Si source gas obtained by vaporizing Si-MMP, and oxygen (oxidizing gas) activated by the remote plasma are alternately fed plural times as shown in FIG. 2. Thereby, on the substrate, a HfSiO film is formed. Between the source gas (Hf source gas, Si source gas) feeding and the oxidizing gas feeding, a step of purging is conducted with $N_2$ (hereinafter, simply referred to as $N_2$ purging). That is, with a procedure made of feeding Hf source gas and Si source gas→purging with $N_2$→feeding oxidizing gas→purging with $N_2$ as one unit (one cycle), the procedure is repeated an arbitrary times to obtain a desired film thickness. The arbitrary times mean one obtained by dividing a desired film thickness by a film thickness obtained by the unit procedure. The Hf source gas and Si source gas may be simultaneously fed, or the respective source gases may be intermittently, that is, separately, fed to the substrate.

When the source gas is fed in the step of forming a film, when, with a feed ratio, Hf-MMP/(Hf-MMP+Si-MMP), during one unit (cycle) where the Hf source and Si source are fed, followed by purging with $N_2$ changing, the cycle is arbitrary times repeated to obtain a desired film thickness, as shown in FIGS. 4, 5 and 6, the Si concentration in a depth direction in the film can be differentiated.

This is because, at the time of film-formation, between a feed ratio (mole ratio) of the Hf source and Si source in one unit of feeding/purging of the source, Hf-MMP/(Hf-MMP+Si-MMP), and the composition ratio in the film, Hf/(Hf+Si), there is a relationship as shown in FIG. 3 below, and thereby when a feed ratio (mole ratio) of the Hf source and Si source, Hf-MMP/(Hf-MMP+Si-MMP) at the time of film-formation is controlled, the Si concentration in a depth direction in the film can be controlled.

Desirably, the Si concentration is preferably made larger on an upper side of the film (a side opposite to a transistor active region at the time of forming a device) and smaller on a lower side of the film (a side of a transistor active region at the time of forming a device). That is, in order that a surface side of the HfSiO film may be larger in the Si concentration than a substrate side, the Hf concentration is preferably made larger on the substrate side than on the surface side. Thus, the step of forming the film is conducted so that the surface side of the HfSiO film may be Si-richer than the substrate side and the substrate side may be Hf-richer than the surface side of the HfSiO film.

Here, the term "Si-rich" means a range of a composition ratio x=Hf/(Hf+Si)=0.1 to 0.5 and the term "Hf-rich" means a range of a composition ratio x=Hf/(Hf+Si)=0.6 to 0.9.

As mentioned above, when the step of forming the film is conducted so that the surface side of the HfSiO film may be Si-richer than the substrate side and the substrate side may be Hf-richer than the surface side of the HfSiO film, owing to the nitriding process described below, it can be made so that nitrogen can be introduced much in the Si-rich layer on the surface side of the HfSiO film and is not introduced into the Hf-rich layer on the substrate side.

In FIG. 2, a case where after a source gas is fed activated oxidizing gas is fed is shown. However, there is as well a case where after oxidizing gas is fed a source gas is fed. This is a case when oxidizing gas activated by the remote plasma is fed in advance on a substrate to improve the characteristics of a deposited film or the like. The method provided in JP-A-2004-6699 and so on shows one where a film deposition due to the MOCVD and oxidation and improvement of the deposited film owing to gas activated by remote plasma are periodically repeated. However, without periodically repeating, according to a general MOCVD method, a deposited film may be formed. The general MOCVD indicates a method where sources are simultaneously or sequentially fed, without a procedure of repetition, to obtain a film. The oxidation and modification process owing to gas activated by remote plasma is called as RPO (Remote Plasma Oxidation) process as well.

A HfSiO film being formed may be a single layer different in the Si concentration in a depth direction. Furthermore, plural layers of HfSiO films different in the Si concentration may be formed (laminated). In this case, a film thickness of a layer on a surface side of the HfSiO film is preferably made thinner than that of a layer on the substrate side.

When the step of forming the film is conducted with Hf-MMP (100%) and Si-MMP (100%) and with a feed ratio of Hf-MMP/(Hf-MMP+Si-MMP) set at 1/6, a composition ratio Hf/(Hf+Si) in a HfSiO film was 63%. When the step of forming the film is conducted with a feed ratio of Hf-MMP/(Hf-MMP+Si-MMP) set at 1/100, a composition ratio Hf/(Hf+Si) in a HfSiO film of 16% could be realized.

In FIG. 3, a Hf-MMP/(Hf-MMP+Si-MMP) feed ratio and a Hf/(Hf+Si) composition ratio in a HfSiO film obtained therefrom are shown. At this time, a film-forming temperature was set at 450° C. and pressure was set at 50 to 200 Pa. Here, in the feed ratio and composition ratio, a percentage expression was used as molar ratio. However, in some cases, a ratio expression to the maximum value of 1 may be used.

In the next place, the step of nitriding is applied to the HfSiO film formed as mentioned above. In the step, for instance, a HfSiO film where the Si concentration in the film is disposed as shown in FIG. 4, that is, a HfSiO film where the Si concentration is made larger on a surface side of the film than the substrate side is subjected to the step of nitriding. Thereby, a HfSiO film having a nitrogen concentration distribution such as shown with a solid line in FIG. 7, that is, a distribution where the N concentration is larger on a surface side of the film than the substrate side can be obtained. Thereby, on the surface side of the film, boron can be inhibited from punching through; as a result, the thermal resistance can be enhanced as a whole. The reason why nitrogen is introduced much on a surface side of the HfSiO film and less on the substrate side (at an interface with the substrate) is due to nitrogen being introduced much into the silicate film when the silicon composition is high in the film. In a HfSiO film uniform in the Si concentration, a nitrogen concentration distribution such as shown by a chain line in FIG. 7 is obtained.

The concentration distributions shown in FIGS. 4, 5, 6 and 7 are schematic ones, and when a step of annealing is added the respective concentration distributions are assumed, owing to the diffusion, to change in the shape.

As the step of nitriding, a method where in a rapid thermal anneal (RTA; Rapid Thermal Anneal) that uses resistance heating or a light source a gas containing nitrogen such as nitrogen ($N_2$) or ammonia ($NH_3$) is used, that is, an RTN (Rapid Thermal Nitridation) process, an RPN (Remote Plasma Nitridation) process where nitrogen is introduced with nitrogen or ammonia activated by remote plasma, and an MMT (Modified Magnetron Typed Plasma Source) nitriding process can be cited. Irrespective of methods of nitriding, the nitrogen concentration distribution that reflects the Si concentration distribution in the HfSiO film can be obtained. Thereby, a range of the control of the nitrogen concentration distribution can be expanded.

In the step of forming the film in the embodiment, in order to apply the step of forming the film with a feed ratio Hf-MMP/(Hf-MMP+Si-MMP) changing, the respective source gases may be intermittently fed and the supply flow rates or supply times of the respective source gases, respectively, may be changed for every predetermined cycle to form the film.

For instance, in an example of film-forming sequence shown in FIG. 8, supply flow rates of the respective source gases are changed for every one cycle. Here, as the respective source gases, a Hf source gas and a mixed source gas obtained by mixing the Hf source gas and the Si source gas (Hf source gas+Si source gas) are used. That is, as the first source gas, a Hf source gas is used, and as the second source gas, in place of the Si source gas, a mixed source gas of the Hf source gas and the Si source gas is used. Every time when the Hf source gas is fed, the supply flow rate of the Hf source gas is lowered, and every time when the mixed source gas is fed the supply flow rate of the mixed source gas is increased, and thereby the supply flow rates of the respective source gases are changed. A cycle where after the Hf source gas and the mixed source gas are fed, the source gases are evacuated under $N_2$ purge, and after the evacuation, an RPO (Remote Plasma Oxidation) process is applied with an oxidizing gas, and the oxidizing gas is further evacuated under $N_2$ purge is repeated, and finally the RPN process is applied. When the supply flow rates of the respective sources are thus changed for every one cycle, the Si concentration can be controlled in a depth direction of the HfSiO film.

Furthermore, in an example of film-forming sequence shown in FIG. 9, supply times of the respective source gases are changed for every one cycle. Every time when the Hf source gas is fed, the supply time of the Hf source gas is reduced, and every time when the mixed source gas is fed the supply time of the mixed source gas is increased. When the supply times of the respective source gases are changed for every one cycle as well, the Si concentration can be controlled in a depth direction of the HfSiO film.

The supply flow rates and supply times of the respective source gases have only to be changed at least for every one cycle and may be changed for every plural cycles.

The step of nitriding, when considering the throughput, is preferably conducted successively to the step of forming a HfSiO film in the reaction chamber 4 same as the reaction chamber 4 where the step of forming a HfSiO film is conducted. In this case, when the step of nitriding is conducted according to the RPN process, a remote plasma unit for activating nitriding gas can share the remote plasma unit 20 for activating oxidizing gas for oxidizing and improving the HfSiO film. Furthermore, the step of nitriding may be conducted in a plasma processing chamber or a thermal processing chamber connected through a transfer chamber to the reaction chamber 4 where the step of forming the HfSiO film is conducted. Still furthermore, in the step of forming the HfSiO film, as the source gas, even in a combination of $Hf[N(C_2H_5)_2]_4$ and $HSi[N(CH_3)_2]_3$ or $Si[N(CH_3)_2]_4$, a similar effect can be expected. Furthermore, even when both of the Hf source and the Si source are not organic sources, a similar effect can be expected. That is, not only in a combination of an organic Hf source and an organic Si source, but also even in a combination of an organic Hf source and an inorganic Si source, a combination of an inorganic Hf source and an organic Si source or a combination of an inorganic Hf source and an inorganic Si source, a similar effect can be expected.

As mentioned above, according to the embodiment, advantages below can be obtained.

(1) The controllability of a composition formula Hf/(Hf+Si) in a depth direction can be enhanced.

(2) Since a Si concentration in a HfSiO film is controlled in a depth direction of a film, when the HfSiO film is later nitrided, in the depth direction of the film a desired nitrogen concentration distribution can be obtained.

(3) Since the Si concentration in the HfSiO film is controlled to control the N concentration in the HfSiO film, the N concentration distribution in the HfSiO film can be easily controlled. Accordingly, a high quality semiconductor device can be manufactured.

(4) Since Si-MMP can be made neither introduced from a Si source gas feed system, a $HfO_2$ film and a HfSiO film can be formed in the same film-forming device with excellent productivity.

Different from the invention where in the step of nitriding nitrogen is introduced into the HfSiO film and the nitrogen concentration in the depth direction in the film is controlled by the silicon concentration in the film of the HfSiO film formed in the step of forming the film, when, after the formation of the HfSiO film, a silicon nitride film (hereinafter, simply referred to as SiN film as well) is deposited on the HfSiO film by means of the CVD or ALD (Atomic Layer Deposition), nitrogen can be avoided from intruding in an interface of the HfSiO film and Si. At this time, however, when a source gas such as silane based gas or the like reduces the HfSiO film during forming of the SiN film, the insulating properties are deteriorated; accordingly, an excellent insulating film cannot be obtained.

Second Embodiment

An example of an improvement in the first embodiment will be specifically explained.

In the first embodiment, it is demanded to increase the Si concentration in the HfSiO film to expand a controllable range of the composition ratio Hf/(Hf+Si). For this, a feed method, in particular, a method of mixing plural Hf sources and Si sources is important.

As a method of feeding sources, there is a method where after each of liquid sources is separately vaporized, these are mixed and fed in the reaction chamber. For instance, after individual sources are separately vaporized through a vaporizer, these are, after mixing in the reaction chamber or an anterior chamber of the reaction chamber (a gas mixing site such as a mixer, a shower head or the like) or directly without mixing, fed to the reaction chamber.

For instance, in a method of mixing with a mixer, a single wafer processing CVD unit such as shown in FIG. 10 is used. A liquid source containing Hf is charged in a first liquid source tank 101 as a liquid source container, a liquid source containing Si is charged in a second liquid source tank 102 as a liquid source container, pressurized inert gas (He, $N_2$ or the like) is introduced from an inert gas introduction piping 112 into the respective tanks to pressurize the insides of the respective tanks, and the respective sources in the respective tanks are pushed out in a first buffer tank 203 and a second buffer tank 204 and received there. The two sources each are flow rate-controlled by a first liquid flow rate controller 205 and a second liquid flow rate controller 206, vaporized by a first vaporizer 103*a* and a second vaporizer 103*b* and converted into gas, mixed in a gas path control piping 109 as a mixer, and thereafter introduced into a reaction chamber 104.

A controller 50 that is a controller controls operations of the respective portions constituting a single wafer processing CVD unit such as the liquid flow rate controllers 205 and 206, the vaporizers 103*a* and 103*b*, the gas path control piping 109, the exhaust unit 105 and so on.

However, when by use of a source feed method as mentioned above, where individual sources, after vaporizing, are mixed and fed into the reaction chamber, Hf-MMP is fed as a Hf source and Si-MMP is fed as a Si source, since Si-MMP is difficult to singularly form the film, it is difficult to increase the Si concentration in the HfSiO film. That is, a controllable range of the composition ratio Hf/(Hf+Si) in the HfSiO film is narrow.

The inventors found that when a source where Hf-MMP is slightly added to Si-MMP is used as the Si source, the reactivity of the Si-MMP can be enhanced, and an amount of Si added to the HfSiO film can be increased with excellent controllability.

The second embodiment is one in which the controllability of such an amount of added Si is enhanced. The second embodiment relates to a manufacturing method of a semiconductor device where in order to heighten an amount of Si introduced into a HfSiO film, among a Hf source and a Si source, either one of a Hf source or a Si source in which a slight amount of the other source is added is used as a source.

More specifically, in the second embodiment, as a single wafer processing CVD unit, a unit same as that shown in FIG. 10 can be used. For instance, Hf-MMP (100%) is used as a Hf source and charged in a first liquid source tank 101. In a second liquid source tank 102, as a Si source, a mixed source where several percent of Hf-MMP is previously contained in Si-MMP is charged. As shown in FIG. 3, in order to control the composition ratio Hf/(Hf+Si) in the range of 10 to 50% (01. to 0.5), a content of Hf-MMP in Si-MMP, that is, a Hf-MMP/(Hf-MMP+Si-MMP) ratio is preferably set less than 10%, and more preferably set less than 1%. The smaller the content of Hf-MMP in Si-MMP is set, the wider the controllable range of the composition ratio Hf/(Hf+Si) in the HfSiO film can be taken. Furthermore, in order to control a desired composition ratio Hf/(Hf+Si) to 50% (0.5) or more, the content of Hf-MMP in Si-MMP has only to be set substantially 10% or more.

When, with Si-MMP in which 1% of Hf-MMP is mixed, a feed ratio was set at Hf-MMP/(Hf-MMP+Si-MMP)=1/100, the composition ratio Hf/(Hf+Si) of the HfSiO film could realize 16%.

Thus, according to the second embodiment, in the formation of the HfSiO film, when a very slight amount such as less than 10% of Hf-MMP is mixed in Si-MMP, a reaction of Si-MMP can be accelerated. The composition ratio Hf/(Hf+Si), even when it is controlled in the range of 0.1 to 0.5, can be stably controlled. Furthermore, when a slight amount of Hf-MMP is mixed in Si-MMP, an amount of Si introduced into the HfSiO film can be heightened from several percents to 80% or more. Still furthermore, even when the composition ratio Hf/(Hf+Si) is controlled in such a small range such as 0.1 to 0.5, it is only necessary to control an amount of Hf-MMP mixed in Si-MMP, there is no need of improving and modifying a flow rate controller of the Hf source to one for use in small flow rate, that is, there is hardly need of modifying a hardware of the unit.

In the foregoing embodiment, as the Si source, Si-MMP to which a slight amount of Hf-MMP is previously added is used. However, in a system where, with Si-MMP (100%), in the middle of a piping to the reaction chamber or vaporizer, flow rates are respectively controlled, a slight amount of Hf-MMP is mixed and may be fed as a Si source or a Hf/Si mixed source.

Third Embodiment

Now, a specific example where the first embodiment is further improved will be described.

In the first embodiment, problems such as mentioned below still remains.

(1) Occurrence of Particles Owing to Mixing of Sources

For instance, in a single wafer processing CVD unit as shown in FIG. 10, two sources, respectively, are vaporized in the first vaporizer 103a and second vaporizer 103b and converted into gases, followed by mixing in the gas path control piping 109, further followed by introducing into the reaction chamber 104. Here, there is a problem in that sources that react on mixing are difficult to use. Even when, neglecting the problem, two sources are introduced and film-formed as mentioned above, particles tends to be generated, and furthermore many problems in the operation of the unit such as clogging of shower holes 25, clogging of an exhaust system including an exhaust piping 114 and so on are generated. Accordingly, it is necessary to select sources that do not cause, on mixing, the problems mentioned above.

(2) Stability and Cost of Feed System

A first source is taken Hf-MMP and a second source is taken Si-MMP. In the reaction chamber 104, a substrate heated to a predetermined temperature is disposed. Two source gases are thermally decomposed and a HfSiO film is deposited on a substrate. At this time, a composition ratio $x=Hf/(Hf+Si)$ of the formed HfSiO film is determined by a mixing ratio $q=(Si-MMP)/(Hf-MMP)$ of the Hf-MMP and Si-MMP. This is shown in FIG. 11. According to the FIG. 11, when a HfSiO film having a composition of $x=0.1$ is wanted to form, it is found that q is necessary to be set in the range of 100 to 1000. In order to feed at such a mixing ratio, since a flow rate of Hf-MMP becomes a very small value, generally it is very difficult to secure the controllability. This is because since the smaller the flow rate becomes, the more difficult the flow rate control becomes, when the flow rate is too small, owing to a problem (limit) of the accuracy of the liquid flow rate controller, the flow rate can be detected only with difficulty. Accordingly, the reproducibility of the feed ratio of the sources is likely to be problematic. A liquid flow rate controller that can control a very slight flow rate such as mentioned above is not present at the present time. Even when an existing flow rate controller is improved and modified to enhance the accuracy, it costs much and is less effective.

(3) Problem upon Introducing Nitrogen in HfSiO Film

When a step of nitriding is applied to a HfSiO film that is low in the Si concentration, that is, Hf-rich, to introduce nitrogen, Hf—N bonds become more abundant than Si—N bonds to deteriorate the insulating properties. This is because while the Si—N bond exhibits the insulating properties the Hf—N bond exhibits electrically conductive properties. Accordingly, the vicinity of a surface of the HfSiO film is necessary to be Si-rich. That is, the composition ratio Hf/(Hf+Si) is necessarily controlled in the range of 10 to 50% (0.1 to 0.5). This will be explained with reference to FIGS. 12 and 13.

As shown in FIG. 12, when a Hf-rich ($x=Hf/(Hf+Si)=0.6$ to 0.9) HfSiO film 31a formed on a substrate 30 is subjected to a step of nitriding, without forming a dense $Si_3N_4$ film in the vicinity of a surface of the HfSiO film 31a, an entirety of the film is easily nitrided, and thereby a film 31b containing both Hf—N bonds and Si—N bonds over an entirety is formed. Accordingly, the insulating properties of the film are lost.

Furthermore, as shown in FIG. 13, when a Si-rich ($x=0.1$ to 0.5) HfSiO film 32a formed on a substrate 30 is subjected to a step of nitriding, in the vicinity of a surface of the HfSiO film 32a a dense nitride film is formed, and the film as a whole becomes difficult to easily nitride. As a result, in the vicinity of a surface, a $Si_3N_4$ film 32b is formed, and downward thereof the HfSiO film 32a tends to remain as it is. This is because a dense $Si_3N_4$ film, being high in the barrier properties, does not allow anything to go through. As a result, in this case, there is an advantage that the insulating properties are lost with difficulty.

From the above, in order not to lose the insulating properties of the HfSiO film, the composition ratio x on a side of a surface of the HfSiO film is necessarily controlled in the range of 0.1 to 0.5. In a method where individual sources are vaporized and mixed, however, the control of the range itself is difficult and a sufficient result is not obtained. Furthermore, there is a trial to deposit SiN on a HfSiO film, however, in this case, as mentioned in the first embodiment, when SiN is deposited, owing to silane based gas being used, the HfSiO film tends to be reduced, as a result, the insulating properties of the HfSiO film can be inhibited from deteriorating with difficulty. Still furthermore, in the case of a SiN film being not one that is formed at high energy, the denseness is lost and the barrier properties are lost. Accordingly, a SiN film formed at low temperatures is highly unusable.

However, the inventors found that when a method where with a mixed source obtained by mixing Hf-MMP and Si-MMP as a first source and with a mixed source obtained by mixing Hf-MMP and Si-MMP at a mixing ratio different from that of the first source or a source made only of Hf-MMP as a second source, these are respectively vaporized and fed to a substrate is used, the foregoing problems can be overcome.

The third embodiment uses such a mixing method. That is, in the step of processing substrate, a first source gas obtained by vaporizing a first source where plural kinds of liquid sources are mixed, and a second source gas obtained by vaporizing a second source obtained by mixing plural kinds of liquid sources at a mixing ratio different from that of the first source or made of one kind of liquid source are fed to a substrate to process the substrate.

In the beginning, in the embodiment, a single wafer processing CVD unit such as shown in FIG. 14 is used. The single wafer processing CVD unit has a reaction chamber 104 where a substrate is processed. The reaction chamber 104 is constituted as shown in FIG. 15. Inside of the reaction chamber 104, a susceptor 42 on which a substrate 30 is placed, a heater 43 that is disposed downward of the susceptor 42 and heats the substrate 30 and a shower head 26 provided with many shower holes 25 are disposed. The reaction chamber 104 is provided with a film-forming gas feed piping 120 for feeding a first source or/and a second source, and an oxidizing gas feed piping 116 for feeding oxidizing gas. Furthermore, the reaction chamber 104 is provided with an exhaust piping 114 for evacuating the inside of the reaction chamber, the exhaust piping 114 being connected to an exhaust unit 105 such as a vacuum pump or the like. The oxidizing gas feed piping 116 is, together with the film-forming gas feed piping 120, connected to the shower head 26, feeds activated oxidizing gas inside of the shower head 26 to apply an RPO process. The RPO process is applied to remove organic matters mingled in a thin film or to improve a thin film.

The oxidizing gas feed piping 116 is connected to a remote plasma unit 121 for applying the RPO. The film-forming gas feed piping 120 is connected to a gas path control piping 109 that can control the gas path to mix the first source and the second source.

To the gas path control piping 109, a first source gas feed piping 117a for feeding gas obtained by vaporizing a first source described below, a second source gas feed piping 117b for feeding gas obtained by vaporizing a second source described below, an inert gas feed piping 118b for feeding inert gas such as $N_2$ or the like and a bypass piping 119 for bypassing the source gas to an exhaust piping 114 on an exhaust side of the reaction chamber 104 are connected.

To the first source gas feed piping 117a, a first vaporizer 103a that vaporizes a first liquid source is connected, and to the first vaporizer 103a a first liquid source feed piping 106a is connected. To the first liquid source feed piping 106a, a first liquid flow rate controller 205 that flow rate controls the first liquid source introduced into the first vaporizer 103a and a first buffer tank 203 that charges the first liquid source are connected. To the first vaporizer 103a, a dilution gas feed piping 118a that feeds a dilution gas for diluting a liquid source carried to the first vaporizer 103a is connected.

Furthermore, to the second source gas feed piping 117b, a second vaporizer 103b that vaporizes a second liquid source is connected, and to the second vaporizer 103b a second liquid source feed piping 106b is connected. To the second liquid source feed piping 106b, a second liquid flow rate controller 206 that flow rate controls the second liquid source introduced into the second vaporizer 103b and a second buffer tank 204 that charges the second liquid source are connected. A dilution gas feed piping 108 that feeds a dilution gas for diluting a liquid source carried to the second vaporizer 103b is branched from the inert gas feed piping 118b and connected to the second vaporizer 103b.

To the first buffer tank 203, a first liquid source feed piping 113c for feeding the first liquid source and a pressure gas feed piping 107a for feeding pressure gas for pushing out a source in the first buffer tank 203 to the first liquid source feed piping 106a are connected. To the second buffer tank 204, a second liquid source feed piping 113d for feeding the second liquid source and a pressure gas feed piping 107b for feeding pressure gas for pushing out a source in the second buffer tank 204 to the second liquid source feed piping 106b are connected.

To the first liquid source feed piping 113c and the second liquid source feed piping 113d, a common mixer 214 that can mix two liquid sources of a Hf liquid source and a Si liquid source at an arbitrary ratio is connected. To the mixer 214, a bypass piping 122 for bypassing a mixed liquid source to an exhaust piping 114 on an exhaust side of the reaction chamber 104, a Hf liquid source feed piping 113a that feeds the Hf liquid source to the mixer 214 and a Si liquid source feed piping 113b that feeds the Si liquid source to the mixer 214 are connected.

To an upstream side of the Hf liquid source feed piping 113a that is connected to the mixer 214, and to an upstream side of the Si liquid source feed piping 113b, a Hf liquid source vessel (first source tank) 101 and a Si liquid source vessel (second source tank) 102 are respectively connected. To the source tank 101 and the source tank 102, pressure gas feed piping 115a and pressure gas feed piping 115b for feeding pressure gas for pushing out the respective sources in the vessels to the Hf liquid source feed piping 113a and the Si liquid source feed piping 113b are respectively connected.

The pressure gas feed pipings 115a and 115b, the dilution gas feed piping 118a, the inert gas feed piping 118b and the pressure gas feed pipings 107a and 107b are branched from a common inert gas introducing piping 115.

The inside of the above-mentioned mixer 214 is constituted as shown in FIG. 16. A flow rate x time set by each of a first liquid flow rate controller 253 connected to the Hf liquid source feed piping 113a and a second liquid flow rate controller 254 connected to the Si liquid source feed piping 113b determines charge amounts and preparation ratios (mixing ratios) of mixing sources to each of the first buffer tank 203 and second buffer tank 204.

Methods of mixing and charging sources are as follows. In the beginning, three air valves 250, 251 and 252 connected to the first liquid source feed piping 113c, the second liquid source feed piping 113d and the bypass piping 122 all are closed and predetermined setting values are set on two flow rate controllers 253 and 254. In the next place, the air valve 252 is opened, a Hf liquid source and a Si liquid source controlled in the flow rate by the flow rate controllers 253 and 254 are exhausted through a bypass line 122 of an exhausting system to an exhaust piping 114, followed by waiting for the flow rates of the respective liquid sources to stabilize. When the flow rates of the respective liquid sources stabilize, the air valve 252 is closed and simultaneously either one of the air valve 250 or air valve 251 is opened. That is, when the mixed source is charged in the first buffer tank 203, the air valve 250 is opened, and when it is charged in the second buffer tank 204, the air valve 251 is opened. The first buffer tank 203 and the second buffer tank 204 are evacuated in advance of charging the mixing sources. This is done to keep the buffer tank clean and to keep the buffer tank vacant. Furthermore, though not shown in the drawing, means for flowing cleaning liquids for cleaning the respective buffer tanks may be separately provided.

Furthermore, a controller 50 that is a controller controls operations of the respective portions that constitute the single wafer processing CVD unit such as the mixer 214, the liquid flow rate controllers 205 and 206, the vaporizers 103a and 103b, the gas path control piping 109, the remote plasma unit 121, the exhaust unit 105 and so on. In the following description, the controller 50 controls operations of the respective portions that constitute the single wafer processing CVD unit.

With a configuration as mentioned above, a substrate 30 is placed on a susceptor 42 in a reaction chamber 104 and the substrate 30 is heated through the susceptor 42 by a heater 43. When a pressure gas such as $N_2$ or the like is fed to a liquid source tank 101 and a liquid source tank 102, the respective liquid sources, that is, a Hf liquid source and a Si liquid source are pushed out to the liquid source feed pipings 113a and 113b, the pushed out respective liquid sources are mixed in a mixer 214, and introduced through the first liquid source feed piping 113c and the second liquid source feed piping 113d to the first buffer tank 203 and the second buffer tank 204 respectively. For instance, in the first buffer tank 203, the first source mixed at the first mixing ratio is charged and in the second buffer tank 204, the second source mixed at the second mixing ratio is charged. When pressure gas is applied to the first buffer tank 203 and the second buffer tank 204, the respective liquid sources, that is, the first source and the second source are pushed out to the first liquid source feed piping 106a and the second liquid source feed piping 106b, the pushed out liquid sources are respectively controlled in the flow rate by the liquid flow rate controllers 205 and 206 and introduced into the first vaporizer 103a and second vaporizer 103b, followed by vaporizing. The respective source gases vaporized by the first vaporizer 103a and second vaporizer 103b, that is, the first source gas and the second source gas, respectively, go through the source gas feed pipings 117a and 117b, are fed through the gas path control piping 109 into the reaction chamber 104. The source gases fed into the reaction chamber 104 are introduced through shower holes 25 of the showerhead 26 on the substrate 30. The source gases introduced on the substrate 30 cause a chemical reaction and uniformly form a HfSiO thin film on a pattern of a fine electric circuit on the substrate 30. Thereafter, a step of $N_2$ purging is conducted to remove a residual gas in the reaction chamber 104, followed by introducing an oxidizing gas activated by the remote plasma unit 121 from the oxidizing gas feed piping 116 onto the substrate 30 in the reaction chamber 104, and thereby a step of improving the HfSiO film is conducted. Thereafter, a step of $N_2$ purging is once more applied to remove a residual gas in the reaction chamber 104. The respective gases introduced into the reaction chamber 104 reach through the exhaust piping 114 and the exhaust unit 105 to subsequent units such as a harm removal unit (not shown in the drawing) or the like.

The third embodiment is largely different from the first embodiment in that the mixer 214 that mixes two sources in liquid at an arbitrary ratio is provided. When the mixer 214 is used, mixing ratios of sources that are charged in the first buffer tank 203 and the second buffer tank 204 can be arbitrarily changed. In particular, even when a feed amount of one liquid source is very small compared to that of the other liquid source, the controllability of the liquid flow rate can be secured.

The reason why even when a feed amount of one liquid source is very small compared to that of the other liquid source, the controllability of the liquid flow rate can be secured is as follows.

As mentioned above, when a HfSiO film having a composition ratio x=Hf/(Hf+Si)=0.1 in the film is formed, a mixing ratio q=(Si-MMP)/(Hf-MMP)=100 to 1000 is necessary. In this case, a supply flow rate of Hf-MMP to that of Si-MMP has to be made a very small value. For instance, when the supply flow rate of Si-MMP is 0.1 g/min, the supply flow rate of Hf-MMP has to be set to 0.0001 to 0.001 g/min. When the supply flow rate of the liquid source becomes too small, owing to the precision limit of the liquid flow rate controller, since the flow rate cannot be detected, the flow rate control cannot be achieved. In particular, when the flow rate is less than 0.05 g/min, the flow rate control becomes very difficult.

In the third embodiment, even when the supply flow rate of Hf-MMP has to be made very small to that of Si-MMP like this, while securing the mixing ratio thereof, the liquid sources are mixed with a total volume thereof increased, and, furthermore, even when the liquid sources are controlled in the flow rate, a flow rate (0.05 to 0.2 g/min) to an extent where a liquid flow rate can be sufficiently controlled while securing the mixing ratio thereof is taken. For instance, Si-MMP: 100 to 1000 g and Hf-MMP: 1 to 10 g are mixed and the mixed liquid source is fed at the supply flow rate of 0.1 to 0.2 g/min. Thereby, since there is no need of controlling the liquid source at a very small flow rate, the controllability of the liquid flow rate can be easily secured.

By use of a unit as shown in FIG. 14, Hf-MMP is charged in the first source tank 101, Si-MMP is charged in the second source tank 102 and, with the mixing ratio thereof changing, the composition ratio x of the HfSiO film was investigated. Results are shown in FIG. 11. An important point here is to select a source that does not react when mixed. Furthermore, compatible sources have to be selected. From such reasons, Hf-MMP and Si-MMP, being excellent in the compatibility, are preferable. From FIG. 11, it is found that in order to make the composition ratio x substantially 0.1 to be Si rich, the mixing ratio q=(Si-MMP)/(Hf-MMP) is necessarily made in the range of substantially 100 to 1000, for instance, substantially 200. A substrate temperature when the HfSiO film is formed was set in the range of 350 to 550° C., the pressure was set in the range of 50 to 200 Pa, and a total flow rate of Hf-MMP and Si-MMP was set in the range of 0.1 to 0.3 g/min.

In the next place, a procedure where, with a single wafer processing CVD unit such as shown in FIG. 14, a HfSiO film is deposited from Hf-MMP and Si-MMP will be described.

From the foregoing results, as a first source, a source mixed at a mixing ratio of Si-MMP/Hf-MMP=200 was charged in the first buffer tank 203, and, as a second source, a source mixed at a mixing ratio of Si-MMP/Hf-MMP=0, that is, Hf-MMP alone was charged in the second buffer tank 204.

In the next place, a substrate 30 was set in the reaction chamber 104, followed by heating the substrate 30 to substantially 350 to 550° C., further followed by feeding a first source gas and a second source gas obtained by vaporizing a first source and a second source respectively to the substrate 30, and thereby a step of depositing a HfSiO film on the substrate 30 was applied. At this time, as shown in FIG. 17, the first source and the second source in the first buffer tank 203 and in the second buffer tank 204 were fed to the substrate so that a total feed ratio (Hf-MMP)/(Hf-MMP+Si-MMP) may change with time. That is, from the second buffer tank 204, the second source was fed so that a relative feed amount to the substrate may linearly change from 1.0 to 0.0, and from the first buffer tank 203, the first source was fed so that a relative feed amount to the substrate may linearly change from 0.0 to 1.0. The change of the relative feed amount was conducted by changing setting values of the first liquid flow rate controller 205 and the second liquid flow rate controller 206 by use of the controller 50 that is a controller. A time zone during which the first source and the second source were actually fed is a duration between film-forming start and film-forming end in FIG. 17. At the end, an RPO process was applied to the formed HfSiO film. As will be described below, the deposition process and the RPO process may be alternately applied.

A composition distribution in a depth direction of the HfSiO film thus formed is shown in FIG. 18. The composition distribution in the film, from a film surface where the composition ratio is 0.1 and Si is rich to an underlayer surface where the HfSiO film comes to an end, the composition ratio is substantially 1.0 and Hf is rich, depicts a continuously and gradually increasing curve. The gradually increasing curve has a inflection point in the middle of the film thickness and varies so as to be convex downward from the film surface to the middle of the film thickness and to be convex upward through the inflection point to the underlayer surface. From FIG. 18, it is found that, in the depth direction of the HfSiO film, the composition ratio can be controlled at least in the range of 0.1 to 0.9.

In the above embodiment, an example where the mixing ratio of the first source in the first buffer tank 203 is Si-MMP/Hf-MMP=200 and the mixing ratio of the second source in the second buffer tank 204 is Si-MMP/Hf-MMP=0 is shown, however, the invention is not restricted thereto. For instance, the mixing ratio of the first source in the first buffer tank 203 may be Si-MMP/Hf-MMP=150 and the mixing ratio of the second source in the second buffer tank 204 may be Si-MMP/Hf-MMP=0.1. Furthermore, the mixing ratio of the first source in the first buffer tank 203 may be. Si-MMP/Hf-MMP=500 and the mixing ratio of the second source in the second buffer tank 204 may be Si-MMP/Hf-MMP=0.5.

Furthermore, a pattern of change of the feed ratio of source gases Hf-MMP/(Hf-MMP+Si-MMP) is neither restricted to one shown in FIG. 17. For instance, patterns shown in FIGS. 19 through 22 may be adopted. One shown in FIG. 19 is an example where the second source in the second buffer tank and the first source in the first buffer tank, respectively, are stepwise decreasingly controlled and increasingly controlled. One shown in FIG. 20 is an example where the second source in the second buffer tank is linearly decreasingly controlled and the first source in the first buffer tank is stepwise increasingly controlled. One shown in FIG. 21, contrary to FIG. 20, is an example where the second source in the second buffer tank is stepwise decreasingly controlled and the first source in the first buffer tank is linearly increasingly controlled. One shown in FIG. 22 is an example where the second source in the second buffer tank is decreasingly controlled like a quadratic function and the first source in the first buffer tank is increasingly controlled like a quadratic function.

Furthermore, the composition distribution in the depth direction of the HfSiO film is not restricted to a graph shown in FIG. 18. For instance, the composition distributions shown in FIGS. 23 through 26 can be adopted. One shown in FIG. 23 is an example where the composition ratio increases like a natural function from a film surface toward a depth direction to the underlayer surface. One shown in FIG. 24 is an example where the composition ratio keeps 0.1 from the film surface to the middle of the film thickness, rapidly increases from the middle of the film thickness to a value close to 1.0, and gradually increases to the underlayer surface where the composition ratio is 1.0. One shown in FIG. 25 is an example obtained by bringing one shown in FIG. 24 to the extremity, where the composition ratio keeps 0.1 from the film surface toward the depth direction to the vicinity of the underlayer surface and rapidly increases from the vicinity of the underlayer surface toward the underlayer surface where the composition ratio is 1.0. One shown in FIG. 26 is an example where the composition ratios at the vicinities of both of the film surface and the underlayer surface are 0.1 and in the middle of the film thickness depicts a normal distribution toward the depth direction, a composition ratio peak of the normal distribution being 1.0.

Still furthermore, in methods of feeding a source, which are shown in FIGS. 17 through 22, the first source and the second source charged in two buffer tanks 203 and 204 are simultaneously fed to the substrate. However, as shown in FIG. 27, the first source and the second source charged in the respective buffer tanks 203 and 204 may be alternately (intermittently) and repeatedly fed. In this case, in the beginning, the liquid source is fed from the second buffer tank 204 followed by feeding the liquid source from the first buffer tank 203. The liquid source (Hf-MMP) from the second buffer tank 204, of which mixing ratio, Si-MMP/Hf-MMP, is set zero, with the relative feed amount at the start of the film-forming set at 1.0, every time when the feeding is repeated, is stepwise diminished in the relative feed amount. In the liquid source (Hf-MMP+Si-MMP) from the first buffer tank 203, of which mixing ratio, Si-MMP/Hf-MMP, is set at 200, every time when the feeding is repeated, the feed amount is stepwise increased and the relative feed amount is set 1.0 at the end of the film-forming.

In FIG. 27, an advantage when the mixing ratio Si-MMP/Hf-MMP of the second source in the second buffer tank 204 is set zero is as follows. When the mixing ratio of the second source charged in the second buffer tank 204 is Si-MMP/Hf-MMP=0, Hf-MMP alone is charged in the second buffer tank 204. At the start of the film-formation, only Hf-MMP is fed from the second buffer tank 204 to the reaction chamber 104. Accordingly, at an initial stage of the film-formation, $HfO_2$ that does not contain Si is formed on the substrate and thereby at an interface with the substrate a film that does not contain Si can be formed. As a result, even when, after a HfSiO film is formed, the step of nitriding is applied to the formed HfSiO film, an interface with the substrate is nitrided with difficulty.

In an example shown in FIG. 27, only feed timings of two kinds of liquid sources are shown. A film-forming sequence, when $N_2$ purging and RPO process are added thereto, becomes ones shown in FIGS. 28 through 30. One shown in FIG. 28 is an example where a procedure of feeding the second source in the second buffer tank→feeding the first source in the first buffer tank→purging with $N_2$→RPO process→purging with $N_2$ forms one cycle. One shown in FIG. 29 is an example where a procedure of feeding the second source in the second buffer tank→purging with $N_2$→RPO process→purging with $N_2$→feeding the first source in the first buffer tank→purging with $N_2$→RPO process→purging with $N_2$ forms one cycle. One shown in FIG. 30 is an example where the second source and the first source are simultaneously fed from the second buffer tank 204 and the first buffer tank 203 and a procedure of feeding the source purging with $N_2$→RPO process→purging with $N_2$ forms one cycle.

Furthermore, to the HfSiO film thus obtained, a step of nitriding is applied by means of for instance an RPN process. Relative numbers of nitrogen atoms (N concentration distribution) at this time are shown in FIG. 31. From FIG. 31, in the vicinity of the surface the HfSiO film is converted to a SiN film, from the vicinity of the surface toward the depth direction to the vicinity of the center of the film thickness the relative number of nitrogen atoms decreases like a quadratic function, in the vicinity of the center of the film thickness the relative number of nitrogen atoms becomes zero, and a value of zero is maintained to the vicinity of the underlayer. Accordingly, it is found that the HfSiO film remains in a lower portion of the film (FIG. 13). Since a HfSiO film where the Si concentration is high in the vicinity of the surface can be formed, such a result is assumed obtained.

In the embodiment, after the step of forming the HfSiO film, the step of nitriding is applied by means of the RPN process or the like. However, as shown in FIG. 32, in the front half of the step of film-formation, the RPO process is applied and in the rear half thereof the RPN process may be applied. That is, in the front half of the step of film-formation, with a procedure of feeding the second source in the second buffer tank→feeding the first source in the first buffer tank→purging with $N_2$→RPO process→purging with $N_2$ as one cycle, the cycle may be repeated plural times, and in the rear half of the step of film-formation, with a procedure of feeding the second source in the second buffer tank→feeding the first source in the first buffer tank→purging with $N_2$→RPN process→purging with $N_2$ as one cycle, the cycle may be repeated plural times.

As mentioned above, according to the third embodiment, excellent advantages below can be obtained.

(1) A mixed liquid source of Si-MMP and Hf-MMP obtained by mixing two kinds of liquid sources charged in the first buffer tank is vaporized at the first vaporizer, a Hf-MMP source that is one kind of liquid source charged in the second buffer tank is vaporized at the second vaporizer, and setting values of the respective first liquid flow rate controller and second flow rate controller are changed with time. Accordingly, the composition ratio Hf/(Hf+Si) of the HfSiO film formed on the substrate can be controlled in the depth direction in the range of 0.1 to 1.0.

(2) When the mixing ratio Si-MMP/Hf-MMP of the Si-MMP and Hf-MMP charged in the first buffer tank is set in the range of 100 to 1000, the composition ratio Hf/(Hf+Si) of the HfSiO film formed on the substrate can be controlled substantially linearly in the depth direction in the range of 0.1 to 1.0.

(3) The step of forming a HfO film with Hf-MMP charged in the second buffer tank as a source, the step of forming a HfSiO film with a mixed liquid of Si-MMP and Hf-MMP charged in the first buffer tank as a source and the RPO process for improving are repeatedly performed; accordingly, while improving the film, the composition ratio Hf/(Hf+Si) of the HfSiO film can be arbitrarily controlled in the depth direction in the range of 0.1 to 1.0.

(4) During the step of forming the HfSiO film, the setting values of flow rates of the respective liquid flow rate controllers are changed to change the Si concentration in the depth direction of the film. Accordingly, in the step of nitriding, in the film, Si—N bonds in accordance with the Si concentration can be formed, and thereby the N concentration can be arbitrarily changed in the depth direction of the film. That is, the nitrogen concentration distribution in the HfSiO film can be continuously and stepwise controlled in the depth direction.

(5) The step of forming the film is conducted with a gas obtained by vaporizing each of plural mixed liquid sources mixed at different ratios in plural tanks. Accordingly, even when the feed amount of one liquid source is very small to that of the other one, the controllability of the liquid flow rate can be secured.

(6) Without applying improvement and modification to an existing flow rate controller, a film small in the composition ratio Hf/(Hf+Si) can be formed. The film-forming speed of the HfSiO film is not so much deteriorated.

(7) Sources Hf-MMP and Si-MMP that do not react when mixed and are compatible each other are selected. Accordingly, the particles can be inhibited from occurring. Accordingly, clogging of shower holes, clogging of an exhaust system including an exhausting piping and so on can be avoided.

REFERENCE NUMERALS

Figure 1:
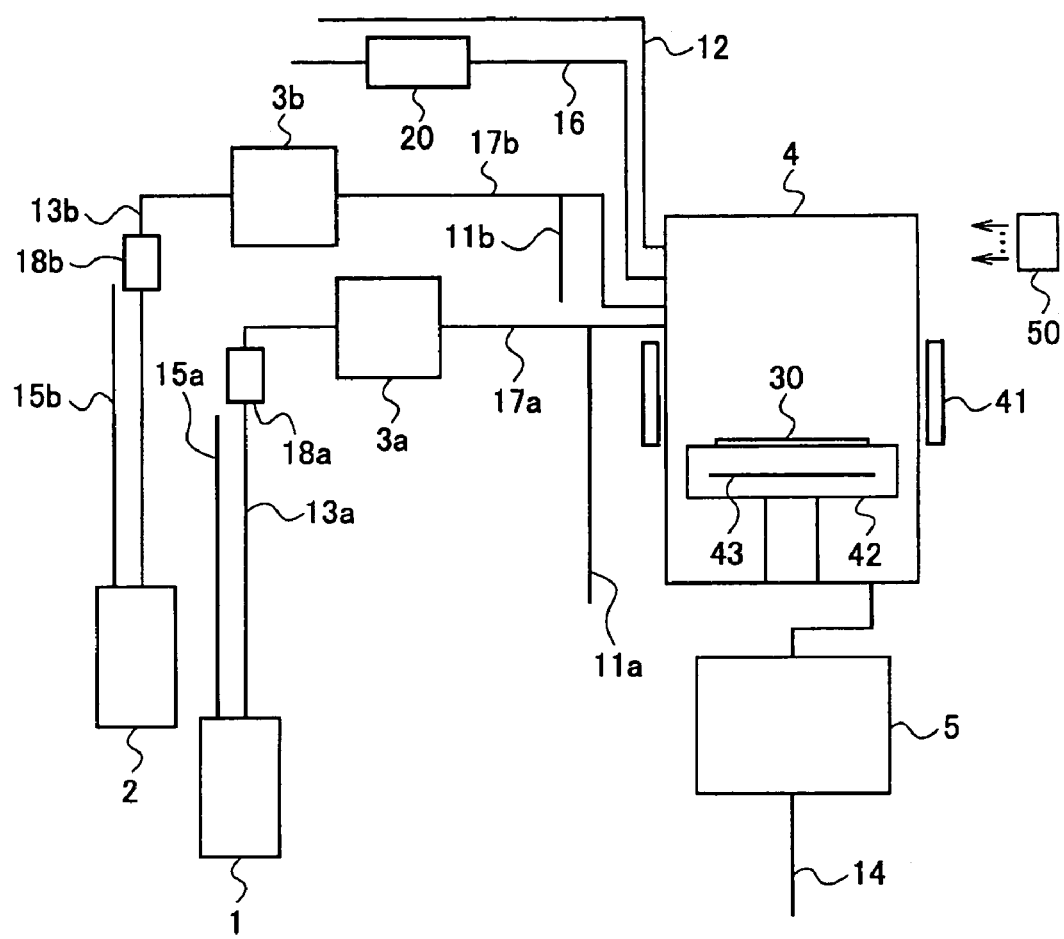
FIG. 1 is a schematic sectional view showing a substrate processing apparatus involving a first embodiment according to the invention.
Figure 2:
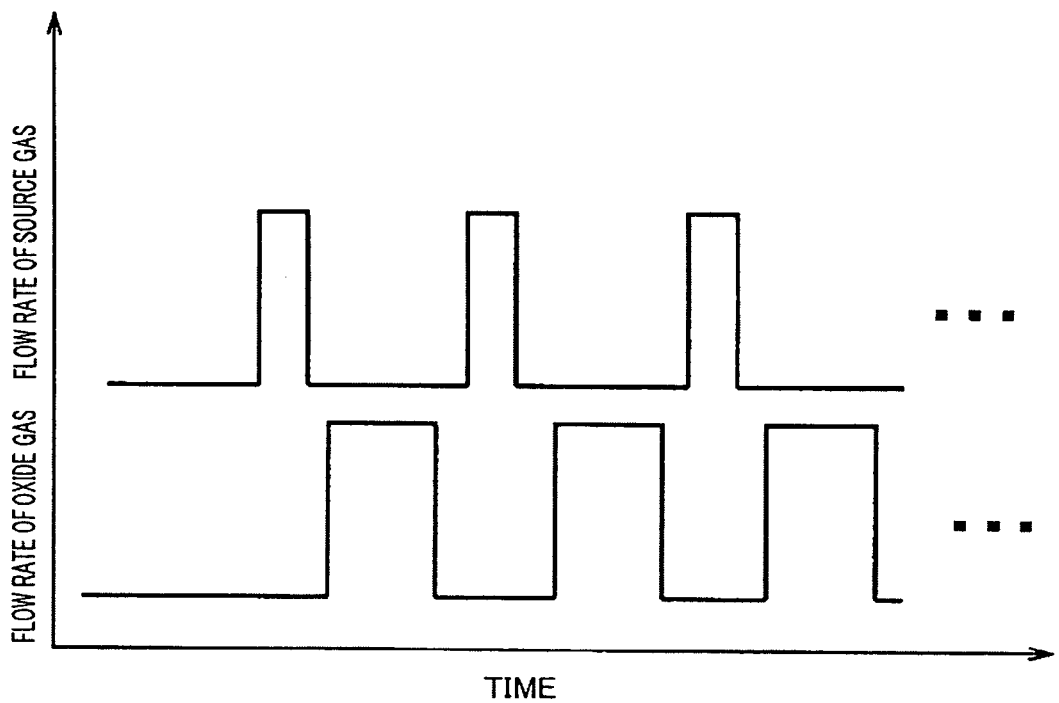
FIG. 2 is a diagram showing a film-forming sequence in the first embodiment.
Figure 3:
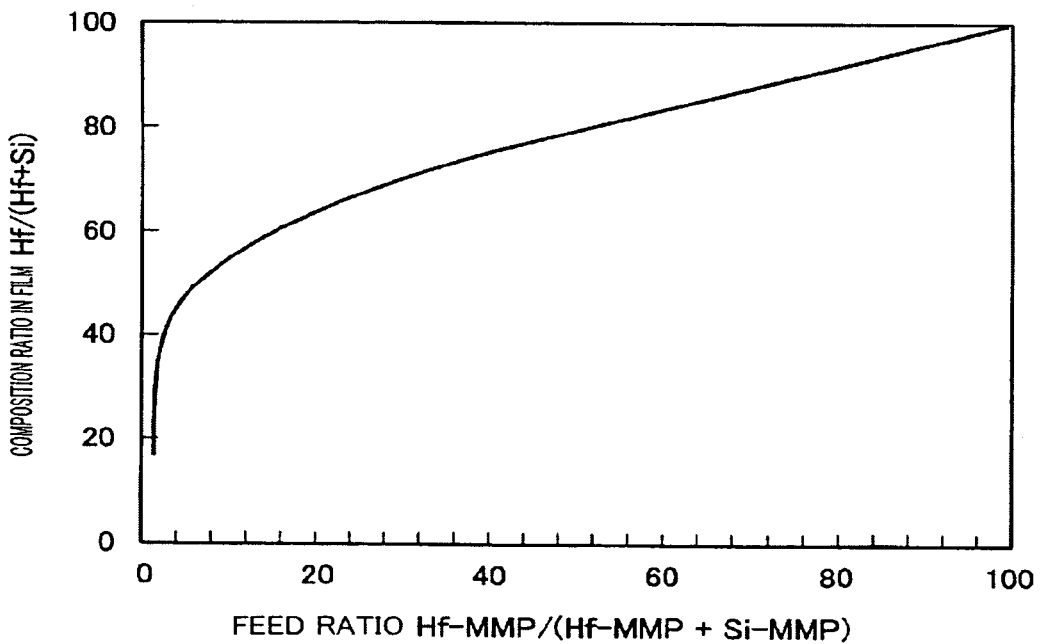
FIG. 3 is a diagram showing a relationship between a feed ratio, Hf-MMP/(Hf-MMP+Si-MMP), and a composition ratio, Hf/(Hf+Si), in a film in the first embodiment.
Figure 4:
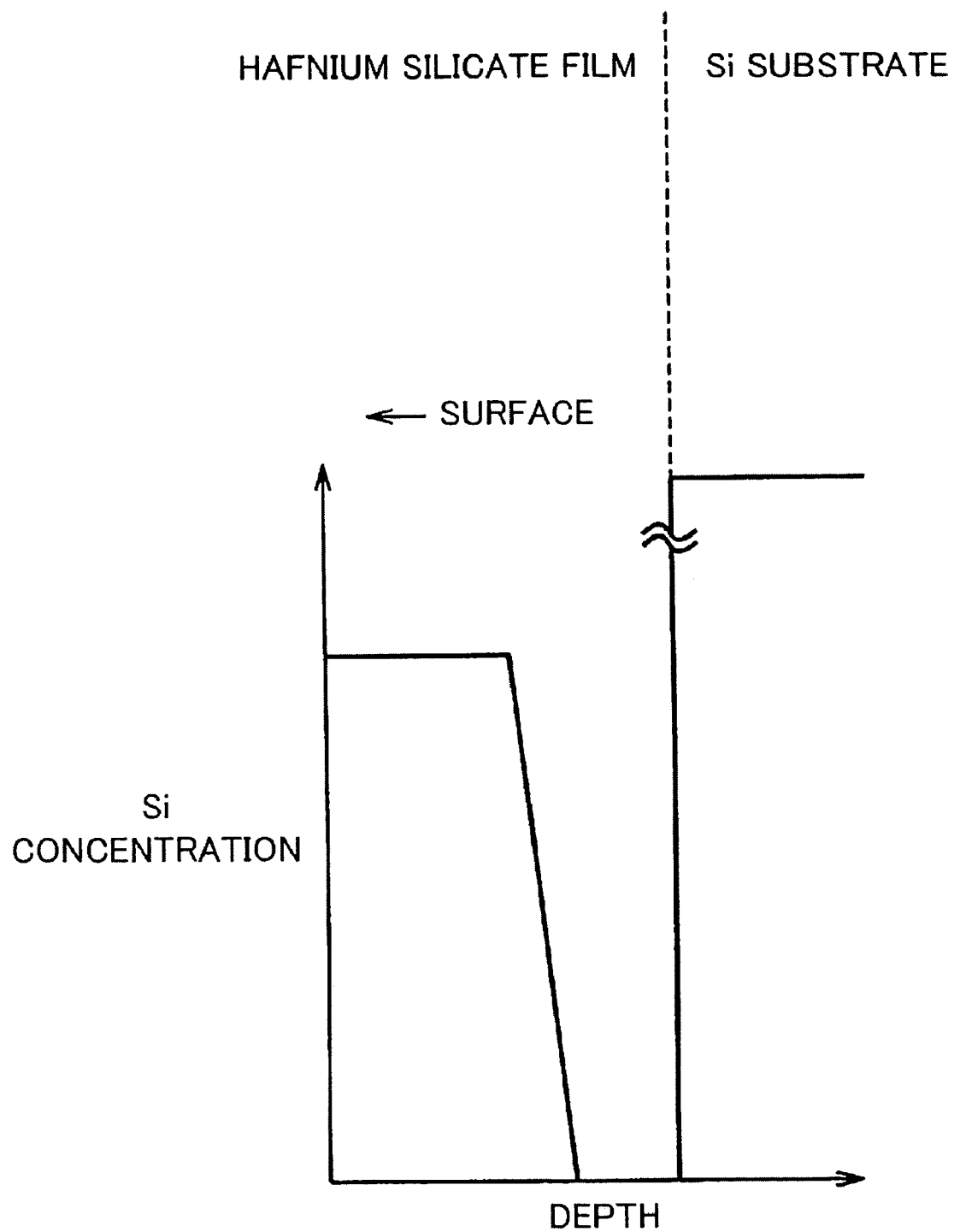
FIG. 4 is a Si concentration distribution diagram in a HfSiO film in the first embodiment.
Figure 5:
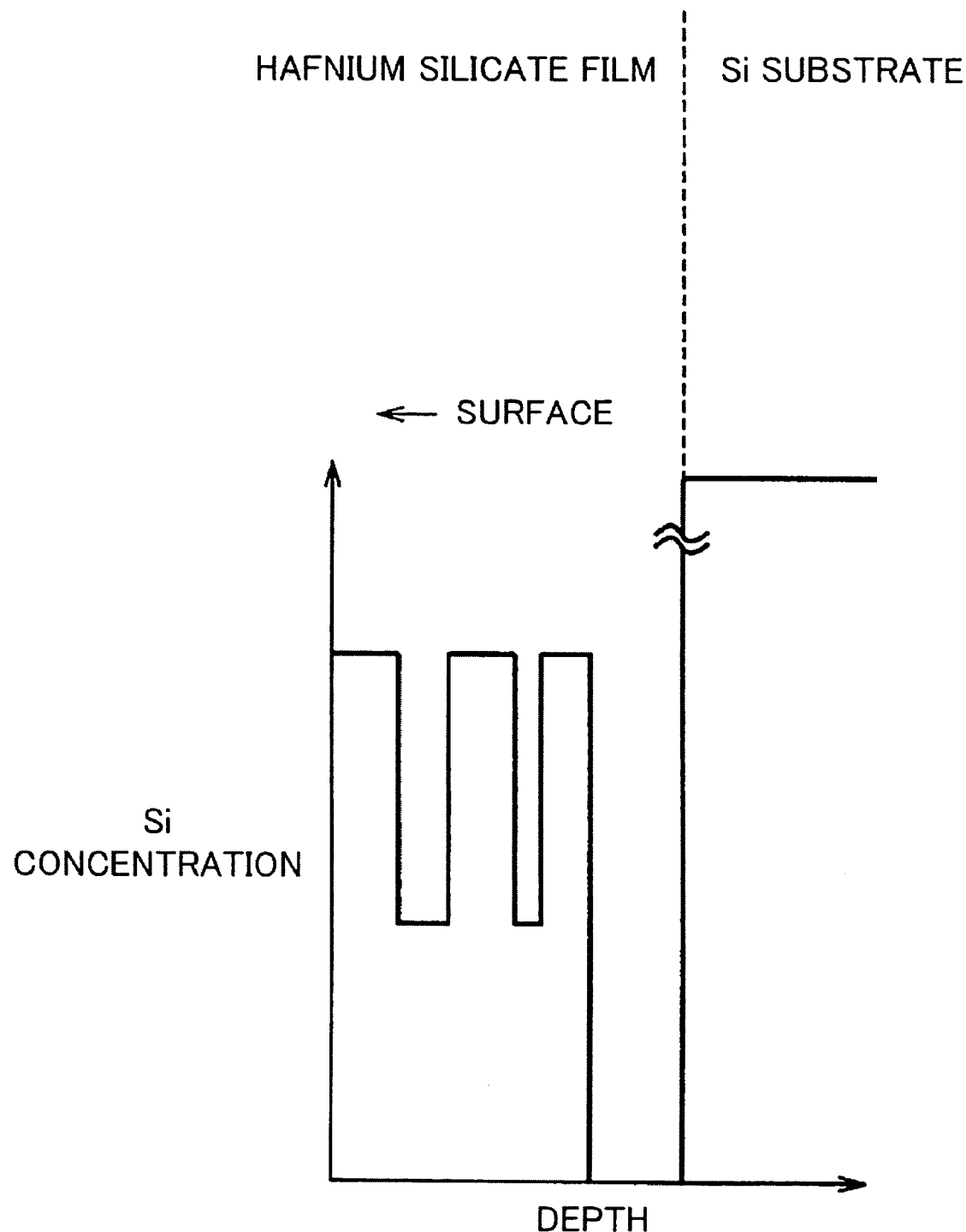
FIG. 5 is a Si concentration distribution diagram in a HfSiO film in the first embodiment.
Figure 6:
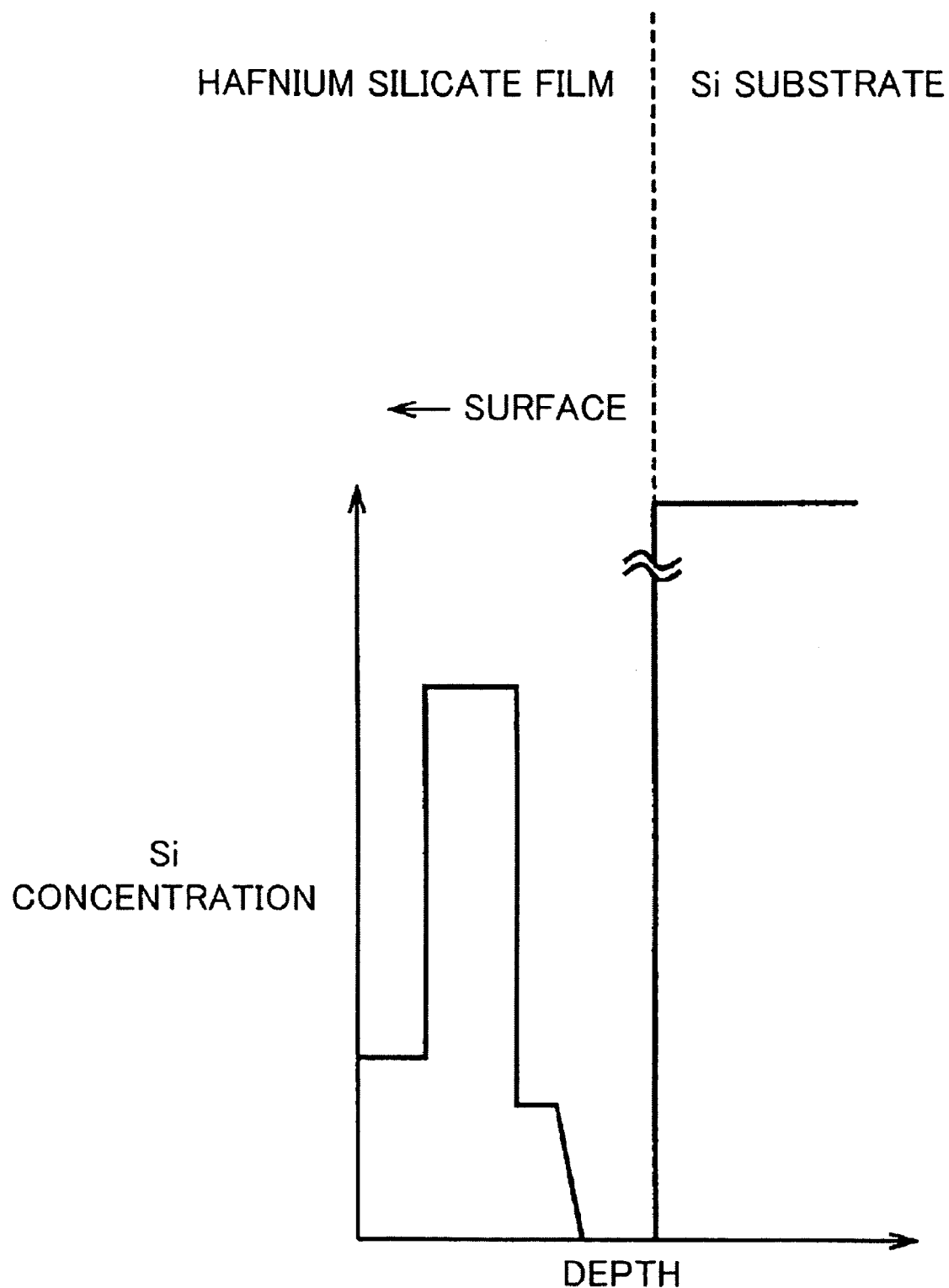
FIG. 6 is a Si concentration distribution diagram in a HfSiO film in the first embodiment.
Figure 7:
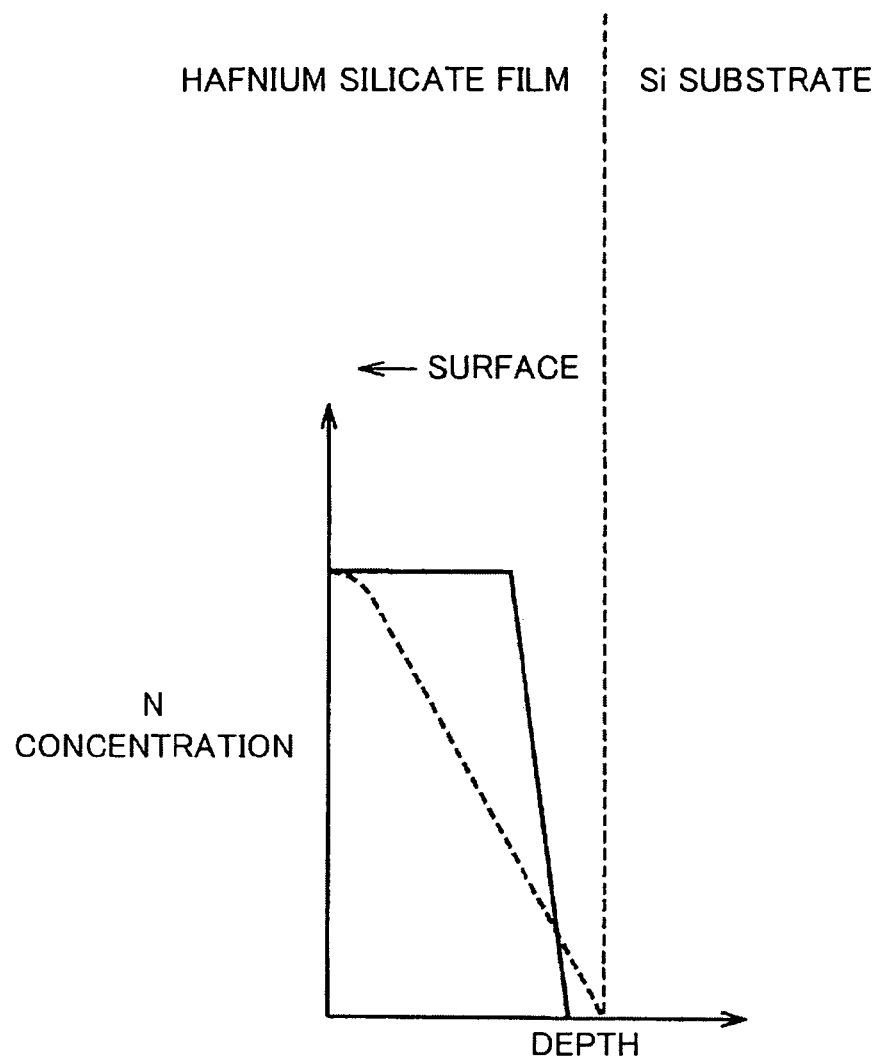
FIG. 7 is a N concentration distribution diagram in a HfSiO film in the first embodiment.
Figure 8:
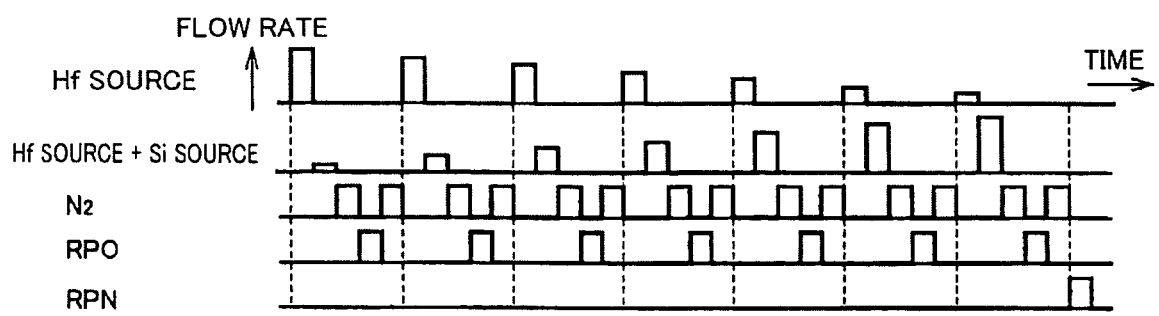
FIG. 8 is a film-forming sequence diagram where supply flow rates of the respective source gases are changed in the first embodiment.
Figure 9:
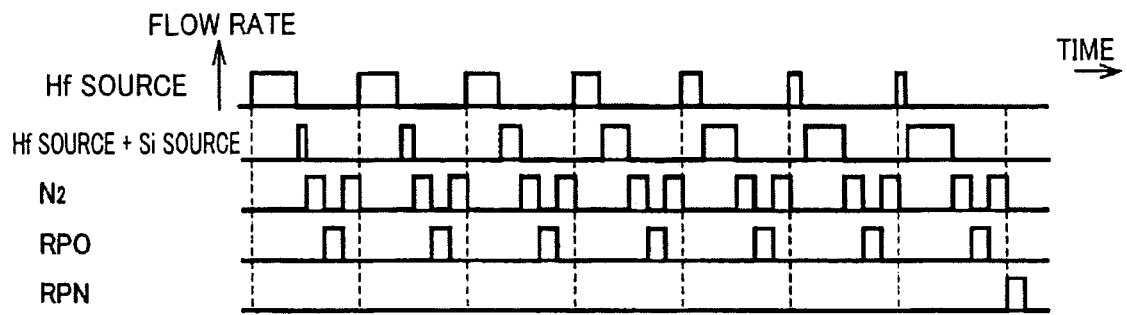
FIG. 9 is a film-forming sequence diagram where feed durations of the respective source gases are changed in the first embodiment.
Figure 10:
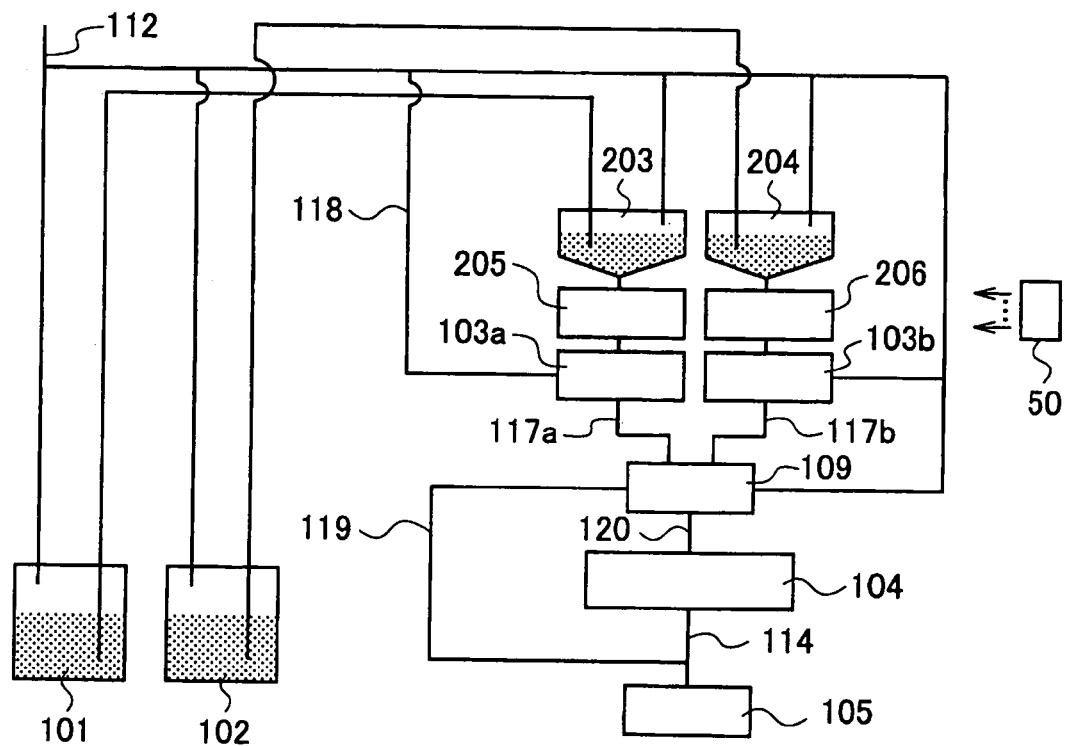
FIG. 10 is a specific configuration diagram of a single wafer processing CVD unit in a second embodiment.
Figure 11:
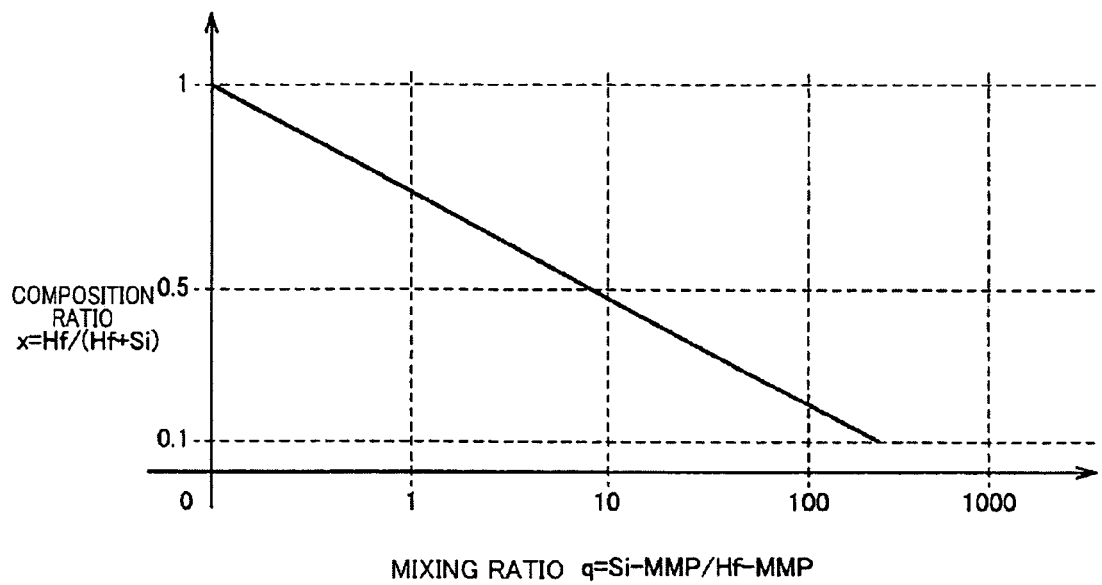
FIG. 11 is a graph showing a relationship between a composition ratio x of a HfSiO film and a mixing ratio q.
Figure 12:
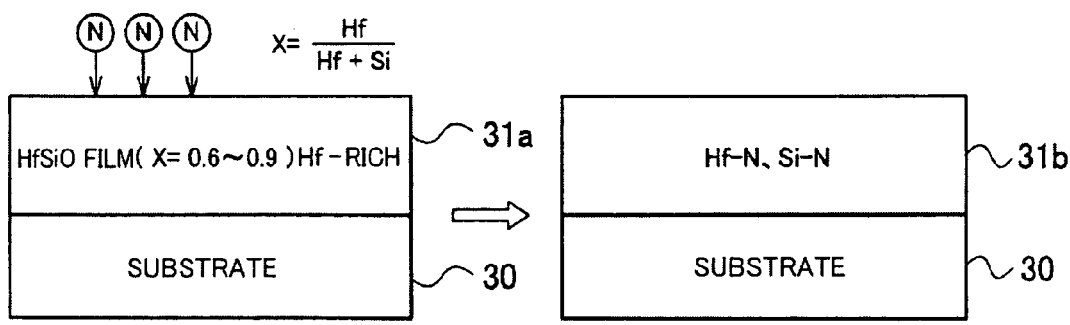
FIG. 12 is an explanatory diagram where a Hf-rich HfSiO film is subjected to a step of nitriding.
Figure 13:
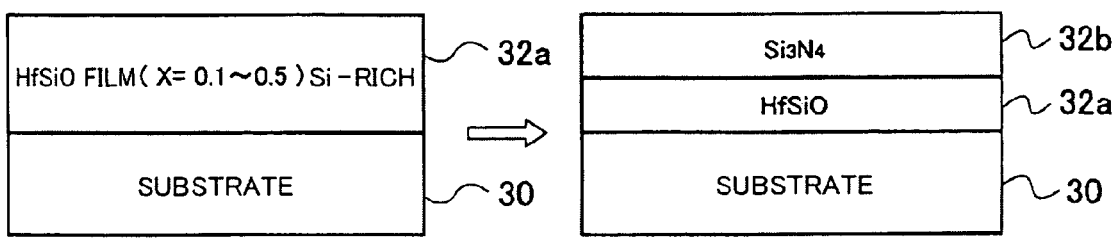
FIG. 13 is an explanatory diagram where a Si-rich HfSiO film is subjected to a step of nitriding.
Figure 14:
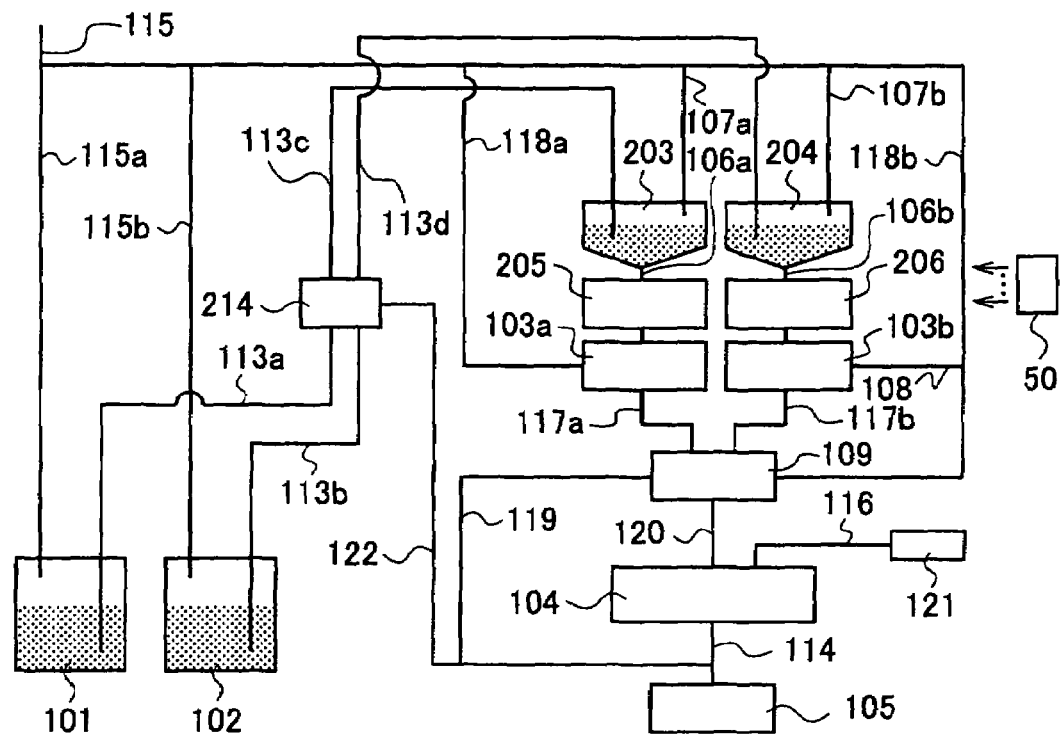
FIG. 14 is a specific configuration diagram of a single wafer processing CVD unit in a third embodiment.
Figure 15:
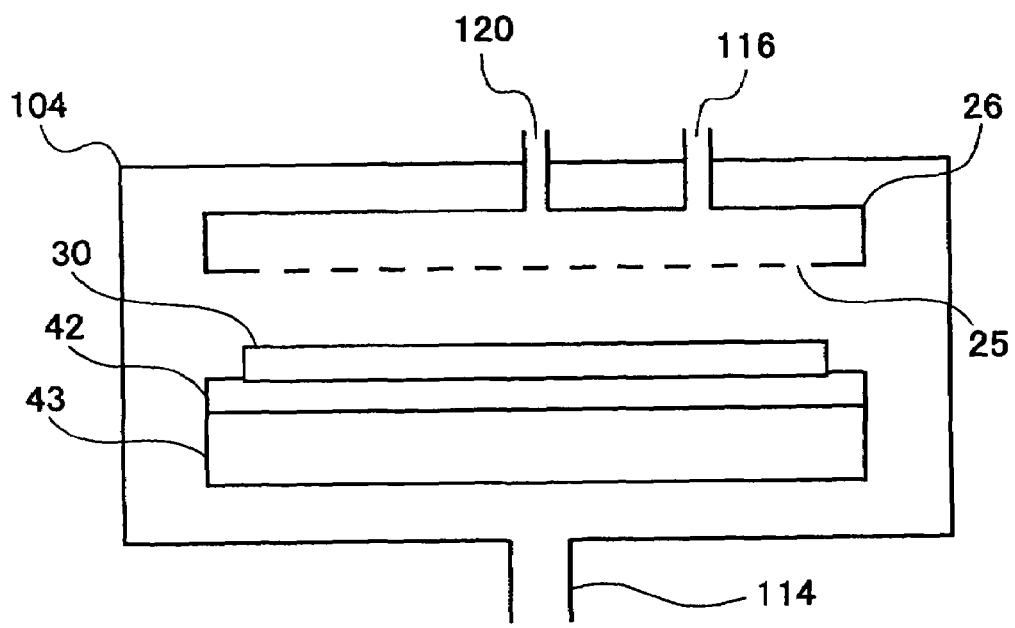
FIG. 15 is a specific configuration diagram of a reaction chamber of a single wafer processing CVD unit in the third embodiment.
Figure 16:
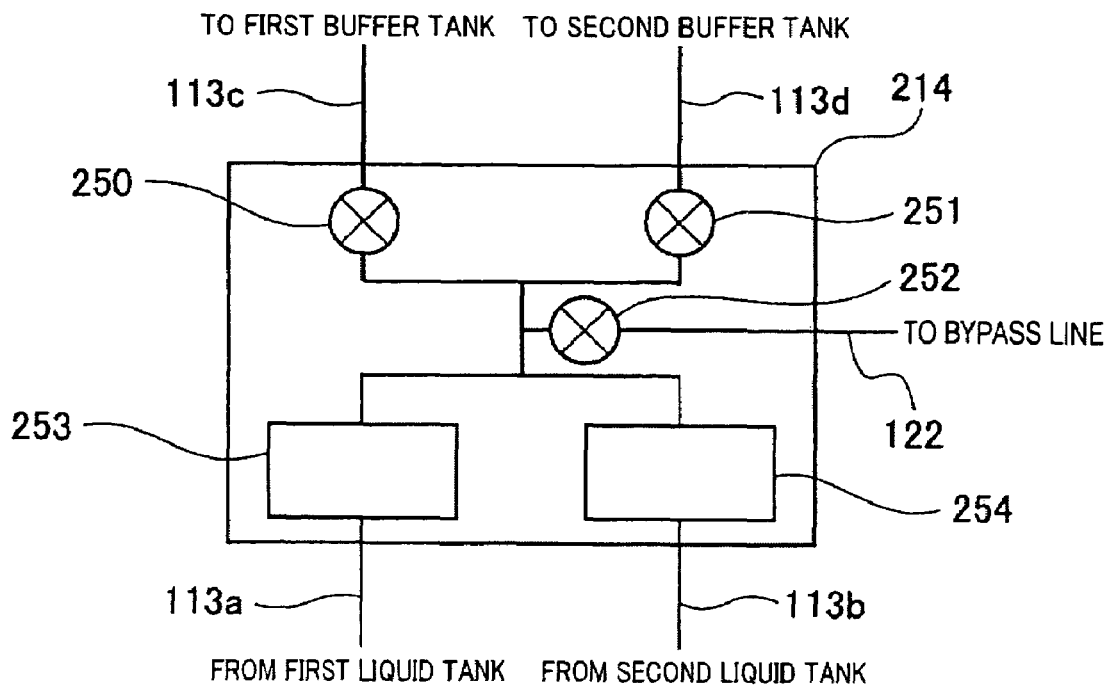
FIG. 16 is a configuration diagram of a mixer in the third embodiment.
Figure 17:
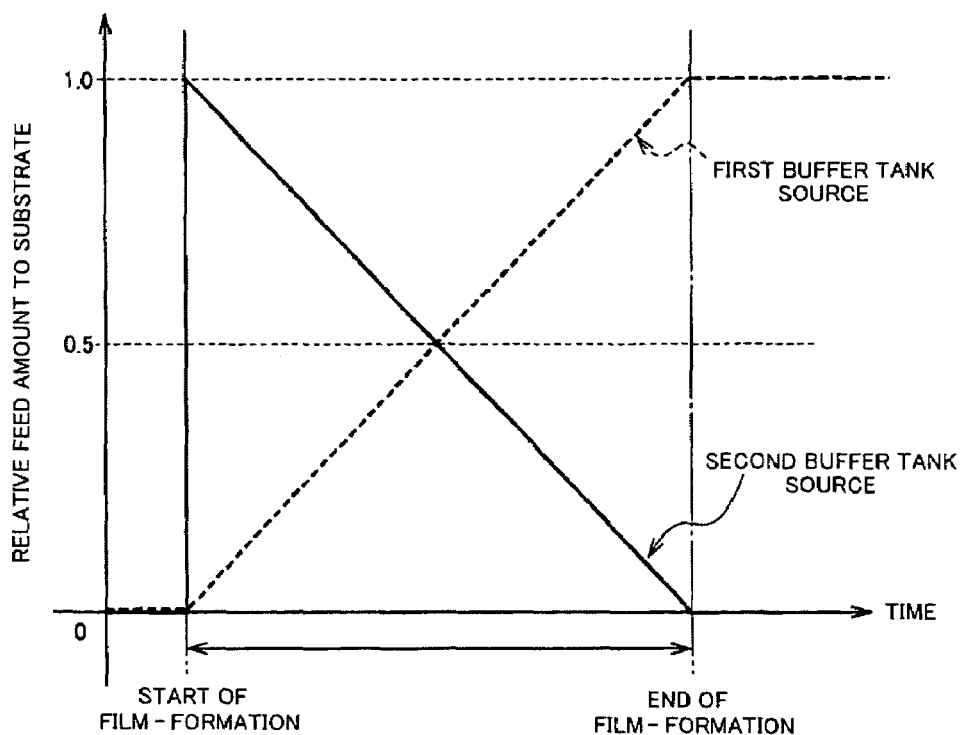
FIG. 17 is a feed chart of the respective sources charged in the respective buffer tanks in the third embodiment.
Figure 18:
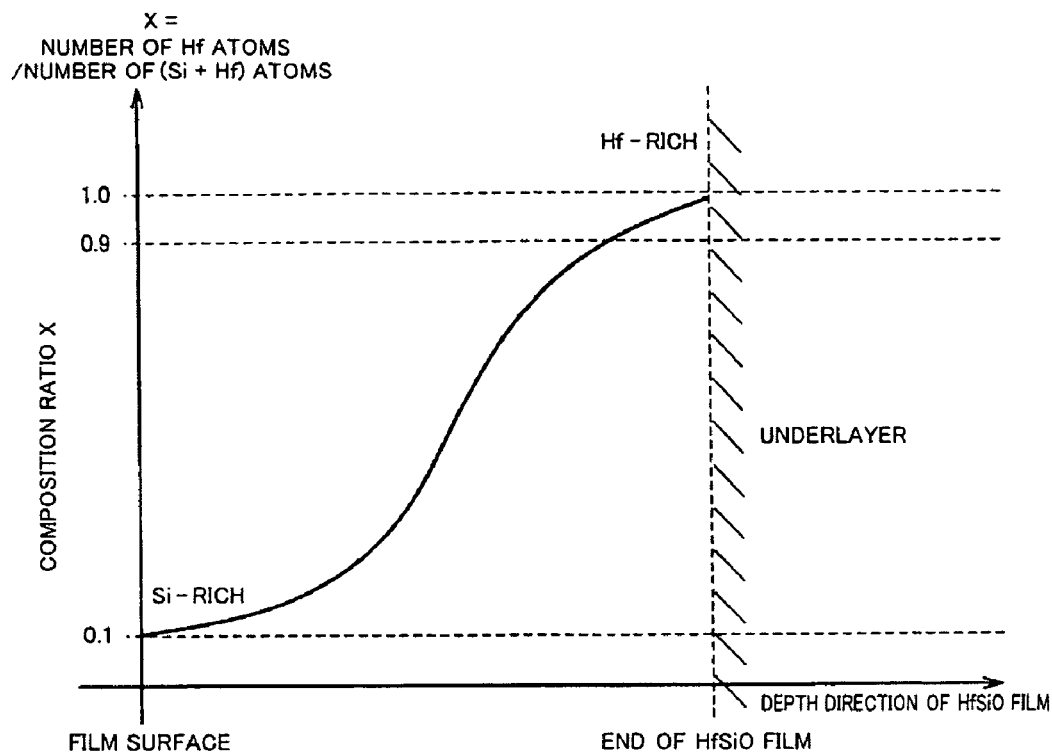
FIG. 18 is a graph showing a composition ratio x of HfSiO in the third embodiment.
Figure 19:
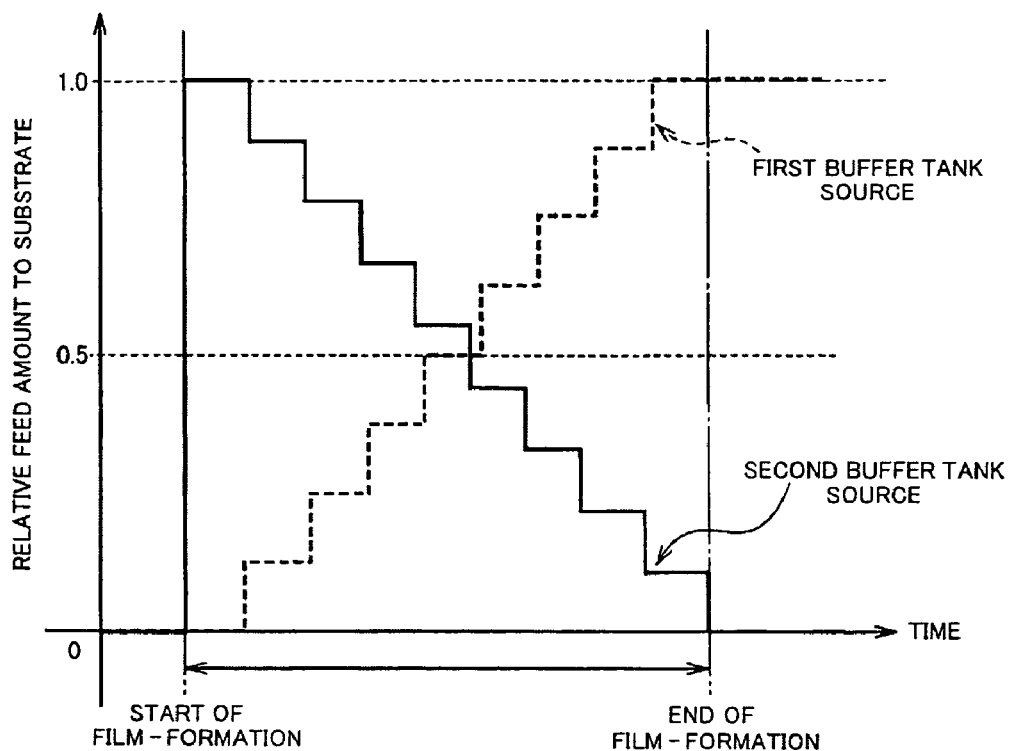
FIG. 19 is a feed chart of the respective sources charged in the respective buffer tanks in the third embodiment.
Figure 20:
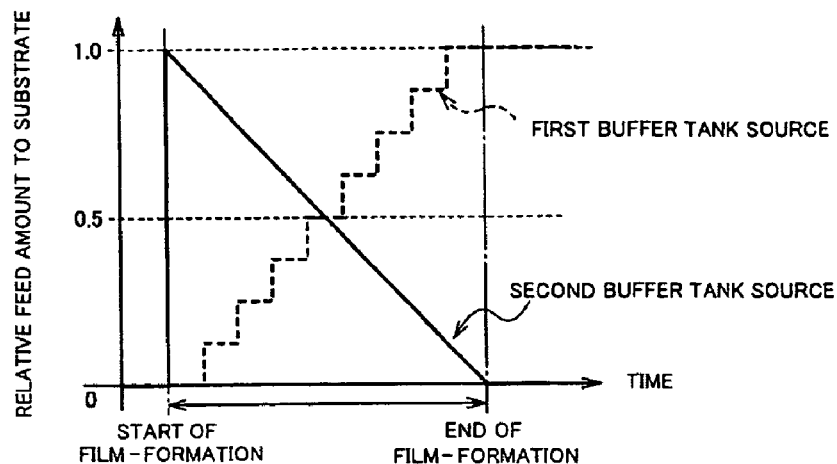
FIG. 20 is a feed chart of the respective sources charged in the respective buffer tanks in the third embodiment.
Figure 21:
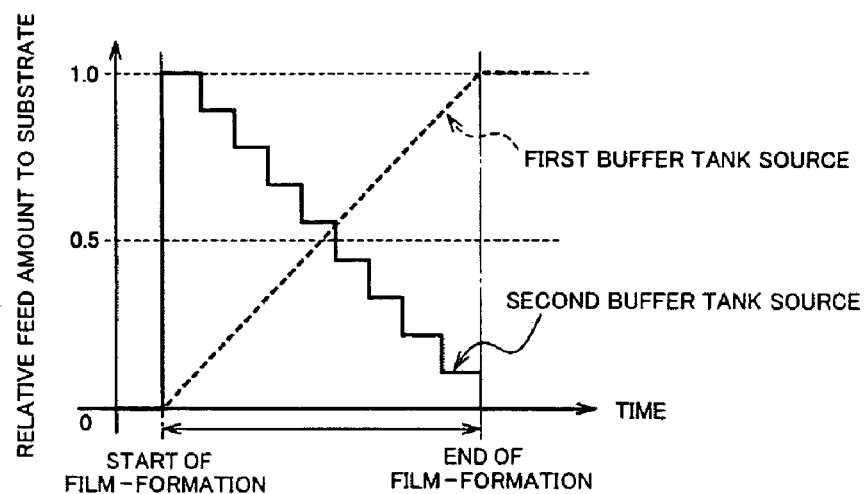
FIG. 21 is a feed chart of the respective sources charged in the respective buffer tanks in the third embodiment.
Figure 22:
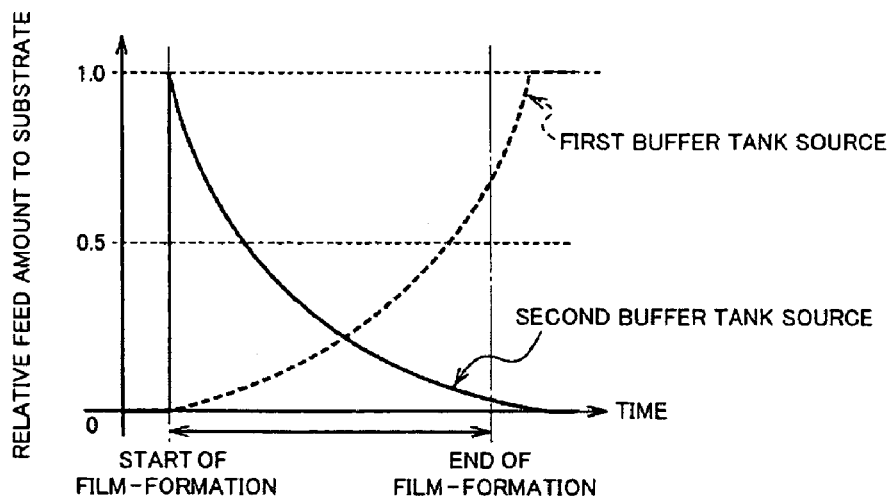
FIG. 22 is a feed chart of the respective sources charged in the respective buffer tanks in the third embodiment.
Figure 23:
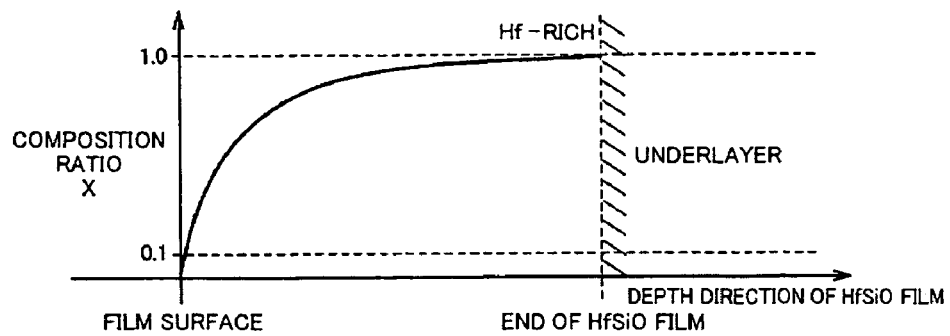
FIG. 23 is a graph showing a composition ratio x of HfSiO in the third embodiment.
Figure 24:
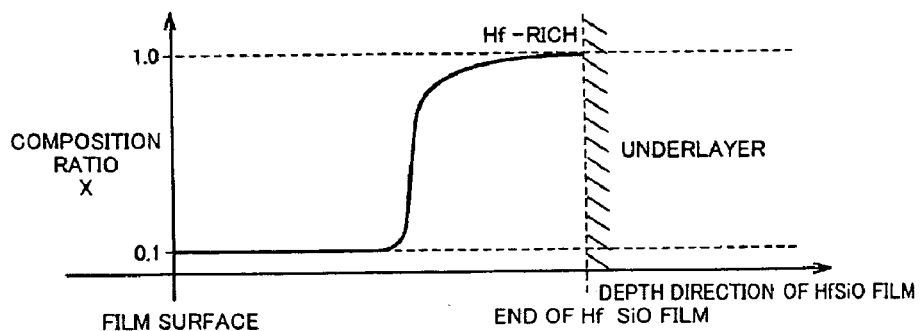
FIG. 24 is a graph showing a composition ratio x of HfSiO in the third embodiment.
Figure 25:
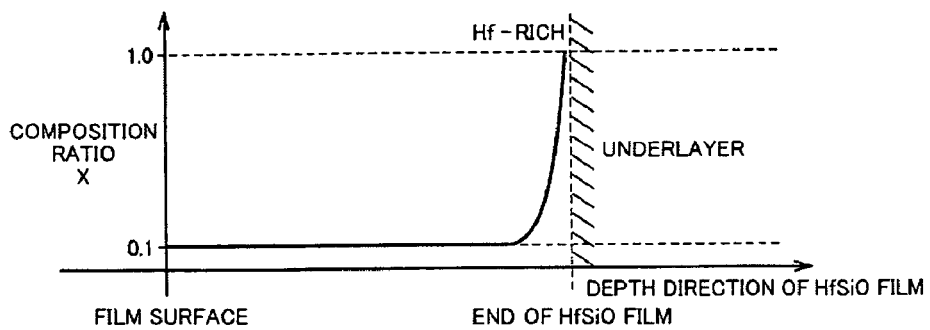
FIG. 25 is a graph showing a composition ratio x of HfSiO in the third embodiment.
Figure 26:
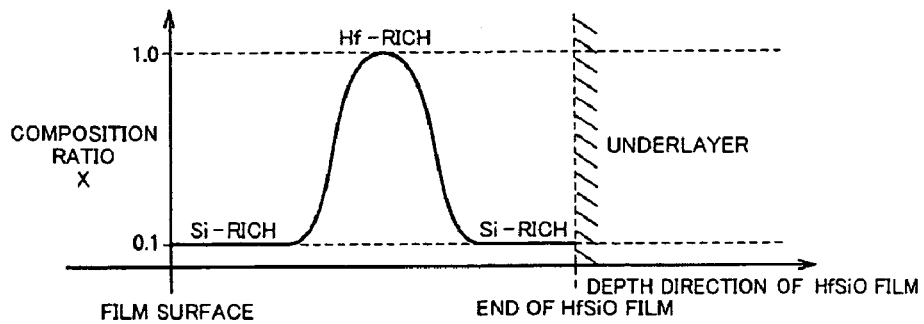
FIG. 26 is a graph showing a composition ratio x of HfSiO in the third embodiment.
Figure 27:
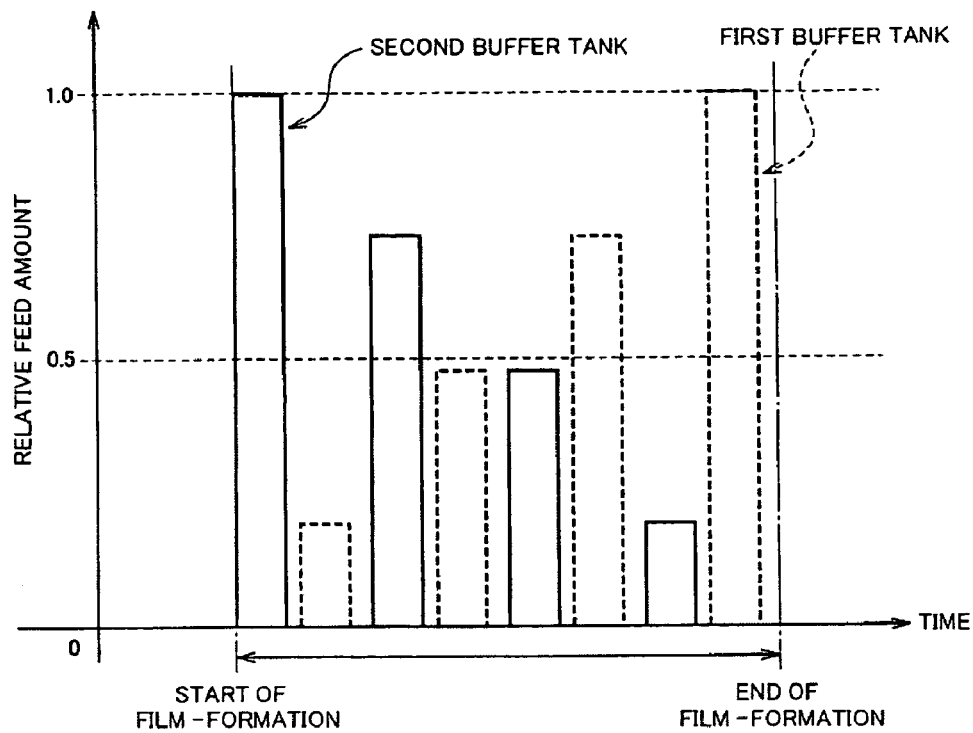
FIG. 27 is a feed chart when the respective sources charged in the respective buffer tanks are alternately fed in the third embodiment.
Figure 28:
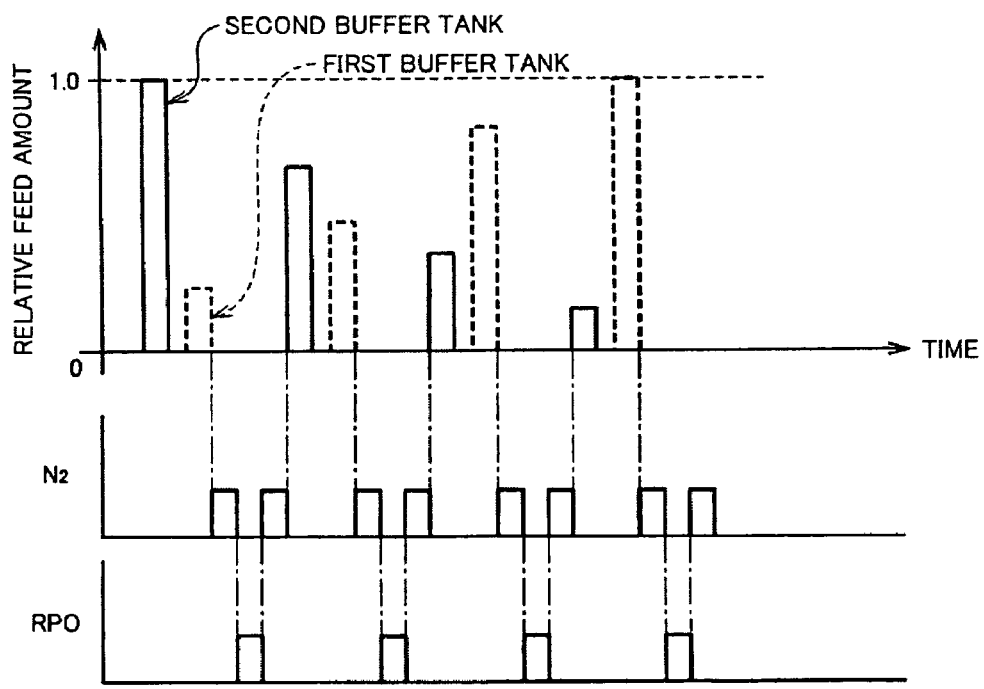
FIG. 28 is a feed chart when the respective sources charged in the respective buffer tanks are alternately fed in the third embodiment.
Figure 29:
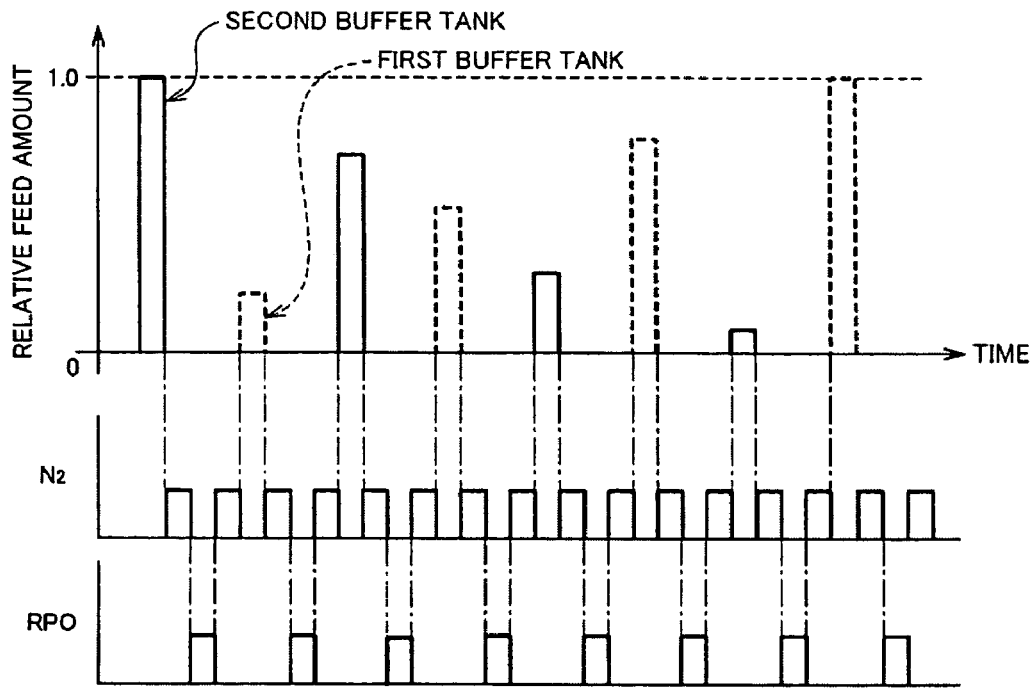
FIG. 29 is a feed chart when the respective sources charged in the respective buffer tanks are alternately fed in the third embodiment.
Figure 30:
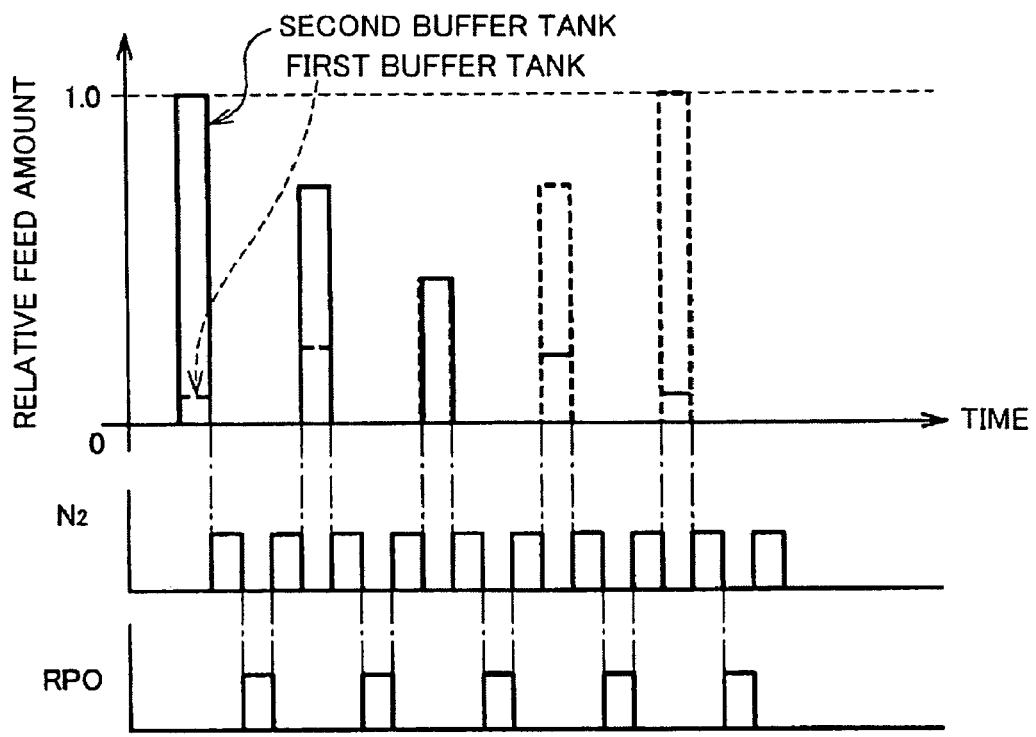
FIG. 30 is a feed chart when the respective sources charged in the respective buffer tanks are alternately fed in the third embodiment.
Figure 31:
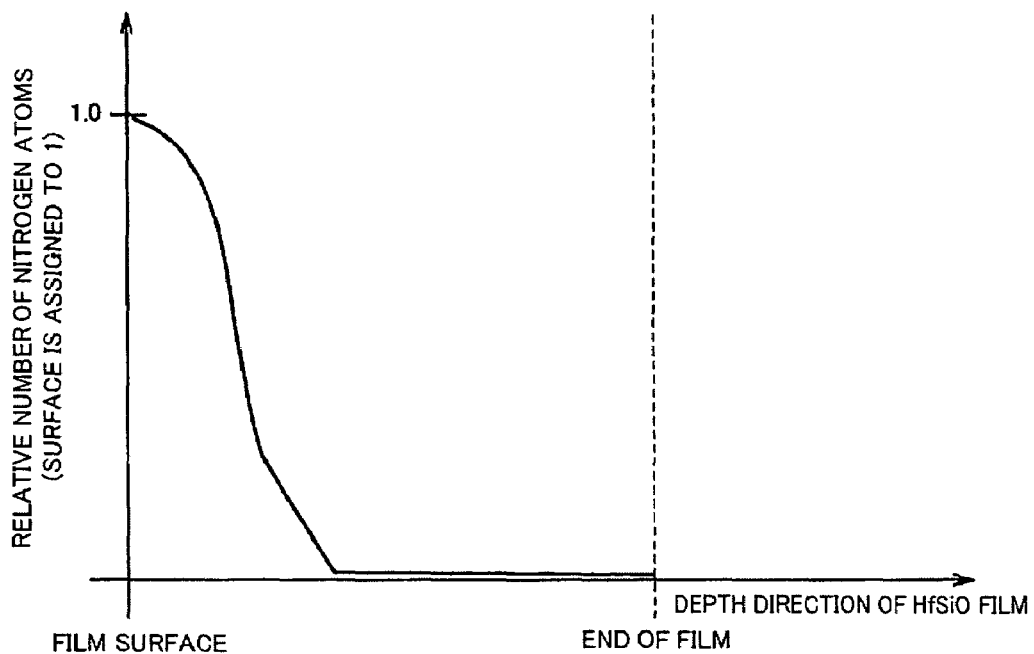
FIG. 31 is a diagram showing a nitrogen concentration distribution when nitrogen is introduced into HfSiO from a surface thereof in the third embodiment.
Figure 32:
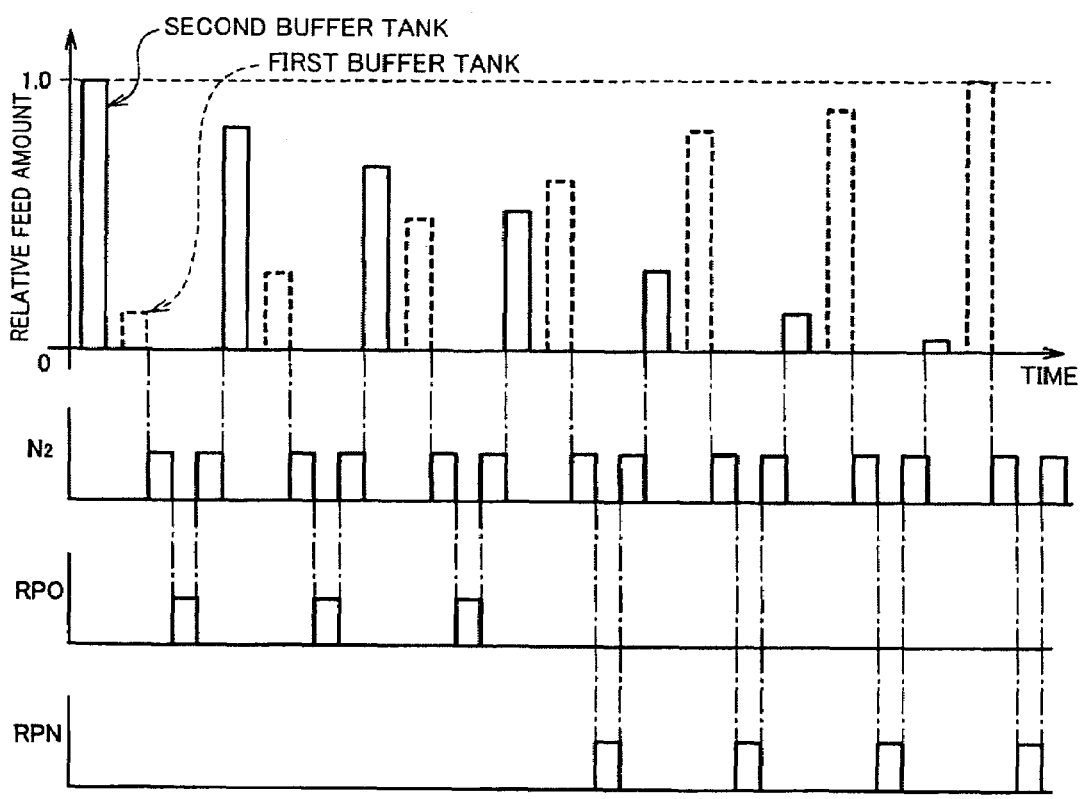
FIG. 32 is a feed chart where an RPN process is added when the respective sources charged in the respective buffer tanks are alternately fed in the third embodiment.

1 source vessel
2 source vessel
3*a* vaporizer
3*b* vaporizer
4 reaction chamber
5 exhaust unit
11*a* bypass piping
11*b* bypass piping
12 purging inert gas feed piping
13*a* Hf liquid source feed piping
13*b* Si liquid source feed piping
14 exhaust piping
15*a* pressure gas feed piping
15*b* pressure gas feed piping
16 oxidizing gas feed piping
17*a* Hf source gas feed piping
17*b* Si source gas feed piping
18*a* liquid flow rate controller
18*b* liquid flow rate controller
121 remote plasma unit

The invention claimed is:
1. A manufacturing method of a semiconductor device comprising the steps of:

carrying a substrate into a reaction chamber;

processing the substrate by feeding a first source gas obtained by vaporizing a first source which is prepared by mixing plural kinds of liquid sources, and a second source gas obtained by vaporizing a second source which is prepared by mixing plural kinds of liquid sources at a mixing ratio different from that of the first source, or composed of one kind of liquid source to the substrate; and carrying the substrate after processing out of the reaction chamber, wherein the plural kinds of liquid sources constituting the first source are a Hf liquid source and a Si liquid source, the one kind of liquid source constituting the second source is either of the Hf liquid source or the Si liquid source, and the process means to form a Hf silicate film; and a mixing ratio of the Si liquid source and the Hf liquid source in the first source (Si liquid source/Hf liquid source) is set to be in the range of from 100 to 1000.

2. A manufacturing method of a semiconductor device comprising the steps of:

carrying a substrate into a reaction chamber;

processing the substrate by feeding a first source gas obtained by vaporizing a first source which is prepared by mixing plural kinds of liquid sources, and a second source gas obtained by vaporizing a second source which is prepared by mixing plural kinds of liquid sources at a mixing ratio different from that of the first source, or composed of one kind of liquid source to the substrate; and carrying the substrate after processing out of the reaction chamber, wherein the plural kinds of liquid sources constituting the first source are a Hf liquid source and a Si liquid source, the one kind of liquid source constituting the second source is either of the Hf liquid source or the Si liquid source, and the process means to form a Hf silicate film; and a composition ratio Hf/(Hf+Si) of the Hf silicate film formed on the substrate is controlled in a depth direction in the range of from 0.1 to 1.0, by changing a supply flow rate of the first source and/or second source in the step of processing the substrate.

3. The manufacturing method of a semiconductor device according to claim 2, further comprising the step of performing a nitriding process for the Hf silicate film formed in the step of processing the substrate.

* * * * *